US009312157B2

(12) United States Patent
Adams et al.

(10) Patent No.: US 9,312,157 B2
(45) Date of Patent: Apr. 12, 2016

(54) WAFER CARRIER

(75) Inventors: Michael S. Adams, Rochester, MN (US); Barry Gregerson, Deephaven, MN (US); Matthew A. Fuller, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/238,693

(22) PCT Filed: Aug. 13, 2012

(86) PCT No.: PCT/US2012/050624
§ 371 (c)(1),
(2), (4) Date: Oct. 21, 2014

(87) PCT Pub. No.: WO2013/025629
PCT Pub. Date: Feb. 21, 2013

(65) Prior Publication Data
US 2015/0041353 A1 Feb. 12, 2015

Related U.S. Application Data

(60) Provisional application No. 61/523,254, filed on Aug. 12, 2011.

(51) Int. Cl.
*H01L 21/673* (2006.01)
(52) U.S. Cl.
CPC .... *H01L 21/67379* (2013.01); *H01L 21/67369* (2013.01); *H01L 21/67373* (2013.01); *H01L 21/67376* (2013.01); *H01L 21/67383* (2013.01); *H01L 21/67386* (2013.01)
(58) Field of Classification Search
CPC ............ B65D 25/107; H01L 21/67369; H01L 21/67373; H01L 21/67379; H01L 21/67386; H01L 21/6732; H01L 21/67763
See application file for complete search history.

(56) References Cited

U.S. PATENT DOCUMENTS

| | | | |
|---|---|---|---|
| 6,010,008 A | 1/2000 | Nyseth et al. | |
| 6,082,540 A * | 7/2000 | Krampotich et al. | 206/445 |
| 6,267,245 B1 | 7/2001 | Bores et al. | |
| 7,316,315 B2 | 1/2008 | Matsutori et al. | |
| 7,370,764 B2 | 5/2008 | Nyseth et al. | |
| 7,523,830 B2 * | 4/2009 | Burns et al. | 206/711 |
| 7,866,480 B2 | 1/2011 | Burns et al. | |
| 8,118,169 B2 * | 2/2012 | Hosoi et al. | 206/711 |
| 2007/0295638 A1 | 12/2007 | Nakatogawa | |
| 2010/0108565 A1 * | 5/2010 | Lu et al. | 206/711 |
| 2011/0000817 A1 | 1/2011 | Hosoi et al. | |
| 2011/0005967 A1 | 1/2011 | Gregerson et al. | |

FOREIGN PATENT DOCUMENTS

| | | |
|---|---|---|
| EP | 1 480 254 A2 | 11/2004 |
| EP | 2 270 847 A1 | 1/2011 |
| WO | WO 2009/089552 A2 | 7/2009 |

* cited by examiner

*Primary Examiner* — Andrew Perreault

(57) ABSTRACT

A front opening wafer container suitable for large wafers such as 450 mm utilizes componentry with separate fasteners to lock the componentry together in an expedient manner providing robust connections and cost efficiencies. A container portion has an open front and receives on a bottom surface a base plate secured by twist lock connectors that also provide recesses for purge grommets. Kinematic coupling components readily and robustly lock onto the base plate. Interior wafer support components latch onto brackets on the side walls utilizing a separate locking insert with holding tabs and locking detents. A wafer retainer provides support and counters enhanced wafer sag associated with 450 mm wafers when the door is installed and seated.

16 Claims, 23 Drawing Sheets

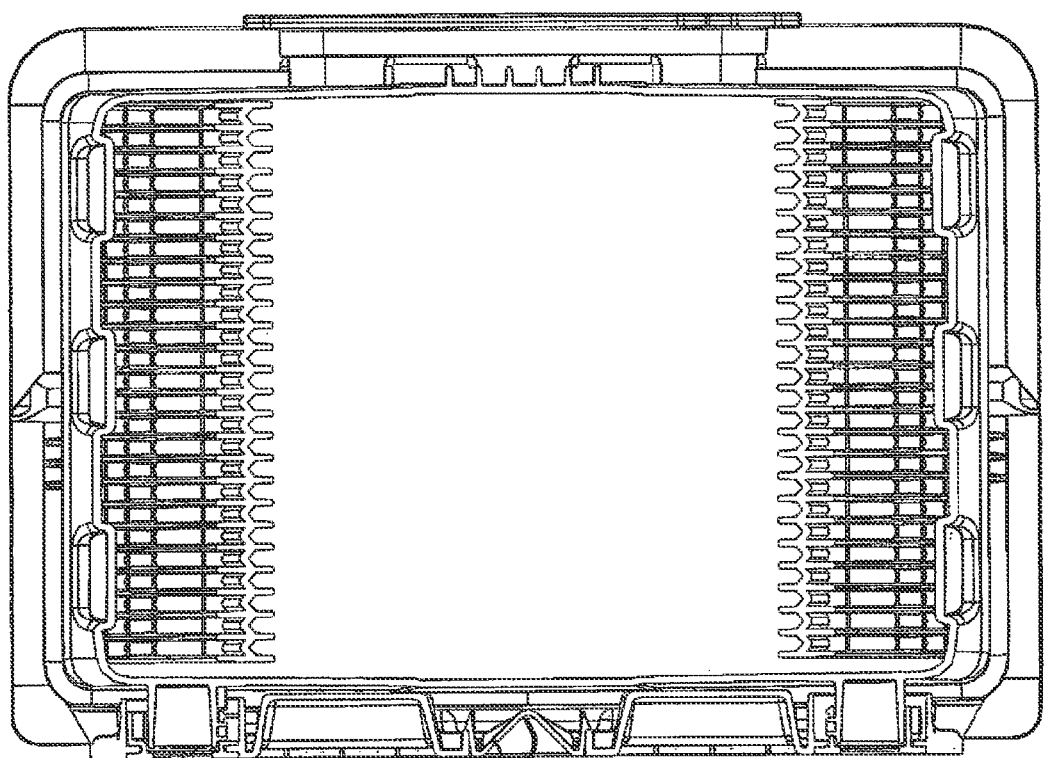
FIGURE 3
FIGURE 3A
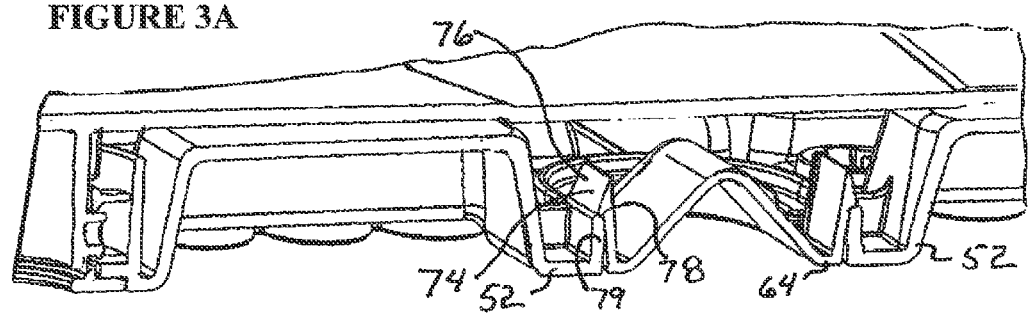
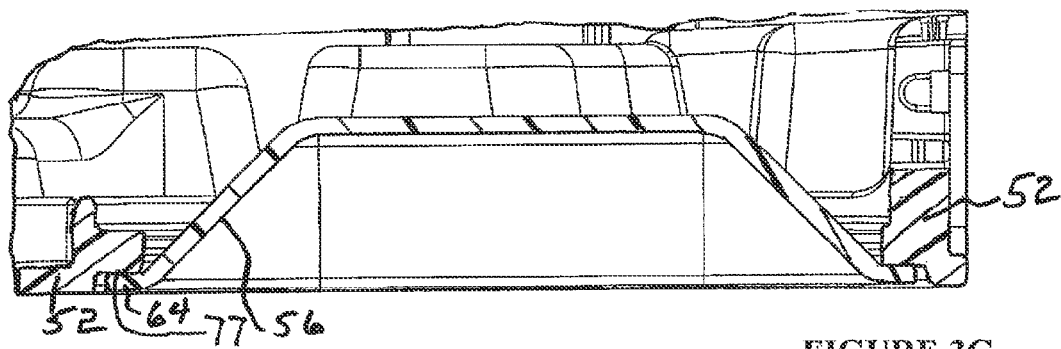
FIGURE 3C

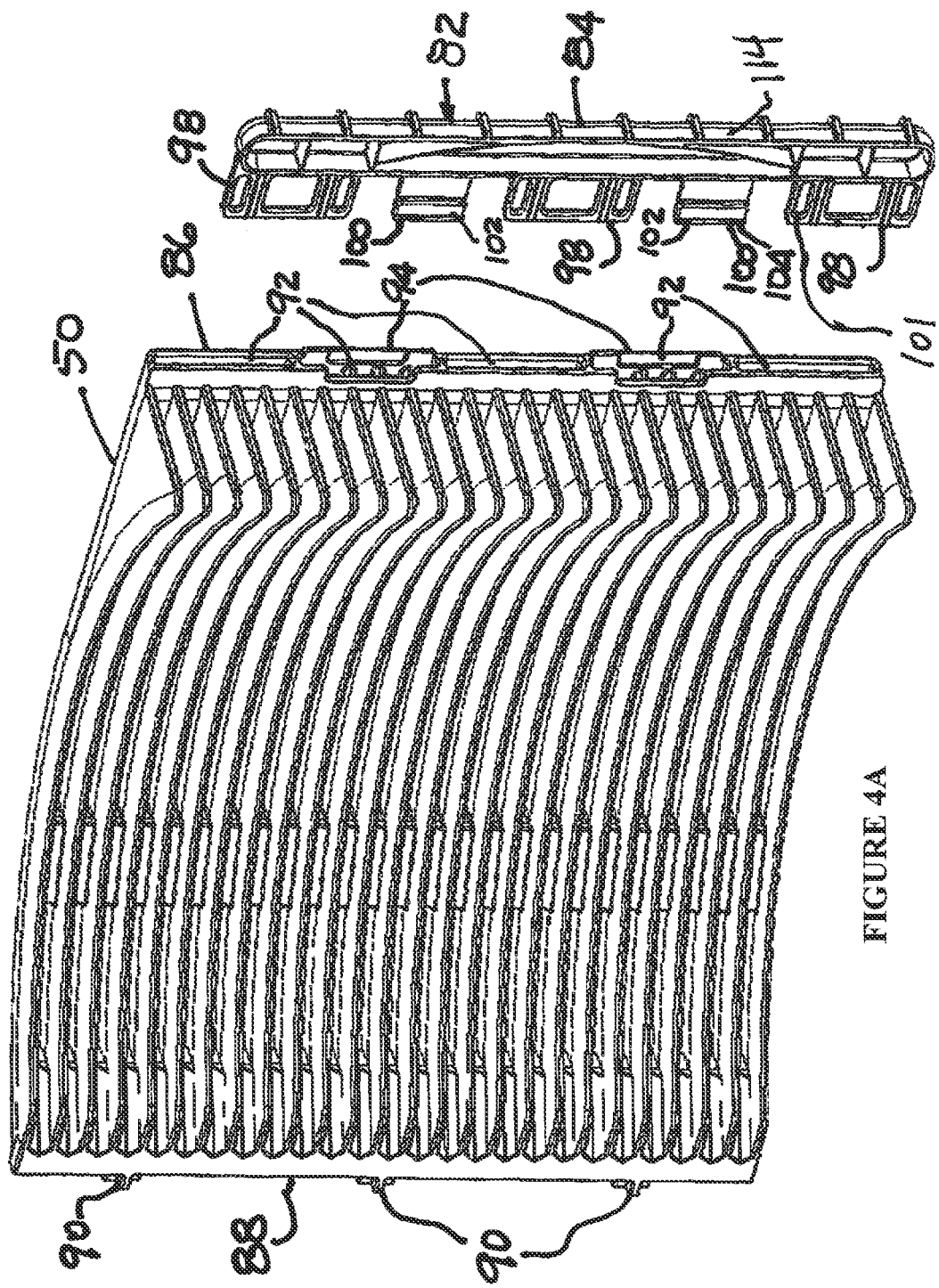

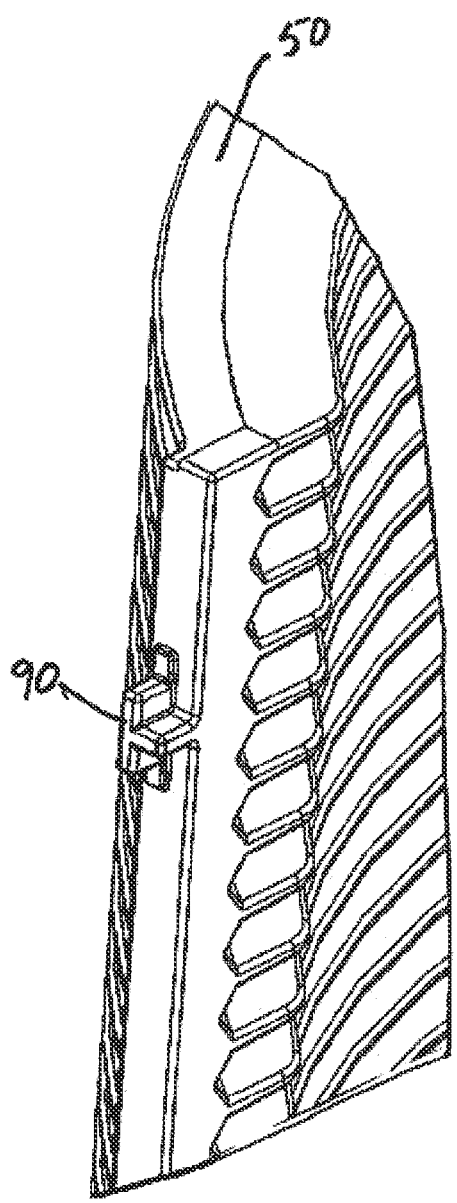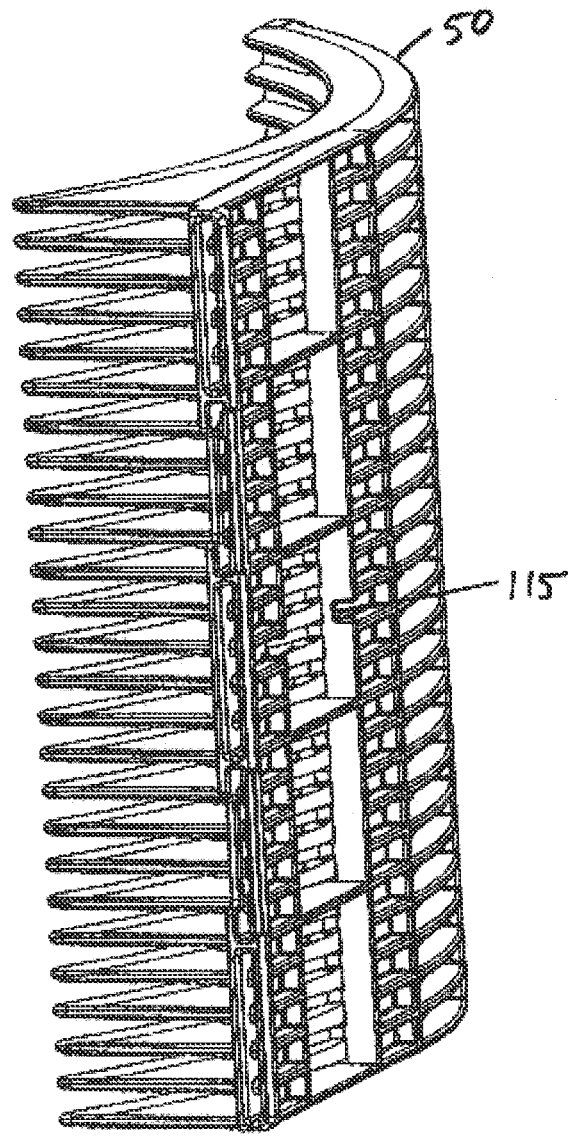
FIGURE 5F
FIGURE 5G

WAFER CARRIER

PRIORITY CLAIM

The present application is a National Phase entry of PCT Application No. PCT/US2012/050624, filed Aug. 13, 2012, which claims priority to U.S. Provisional Patent Application No. 61/523,254, filed Aug. 12, 2011, the disclosures of which are hereby fully incorporated by reference in their entirety.

FIELD OF THE INVENTION

This invention relates to containers for sensitive substrates such as semiconductor wafers and in particular to components and assembly of the components into such containers.

BACKGROUND OF THE INVENTION

Integrated circuits such as computer chips are manufactured from semiconductor wafers. These wafers are subjected to numerous steps during the process of making integrated circuits. This generally entails transporting a plurality of wafers from one workstation to another for processing by specialized equipment. As part of the processing procedure, wafers may be temporarily stored or shipped in containers to other plants or to end users. Such intra-facility and extra-facility movements may generate or expose the wafers to potential wafer ruining contaminants. In order to reduce the deleterious effect of contaminants on wafers, specialized containers have been developed to minimize the generation of contaminants and to isolate wafers from contaminants exterior to the containers. A principal feature common to these containers is that they are provided with removable doors or closures to enable access to the wafers inside.

Plastic containers have been used for decades for transporting and storing wafers in-between process steps. Such containers have highly controlled tolerances for interfacing with processing equipment as well as the equipment/robots that transport the containers. Moreover, it is desirable in such plastic containers to use components that are attachable and removable without using metallic fasteners such as screws, since metal fasteners can cause particle generation when inserted and removed.

Additional, required or desirable characteristics of containers to transport and/or store semiconductor wafers include light weight, rigidity, cleanliness, limited gaseous emissions, and cost effective manufacturability. The containers provide hermetic or close to hermetic isolation of wafers when the containers are closed. Simply stated, such containers need to keep the wafers clean, uncontaminated, and undamaged. Additionally, carriers need to maintain their capabilities under the rigors of robotic handling which includes lifting the carrier by the robotic flange positioned at the top of the container as well as transporting such carriers by way of conveyor systems that engage conveyor flanges on outside surface of side walls of the containers.

Front opening wafer containers have become the industry standard for transporting and storing large diameter 300 mm wafers. In such containers the front door is latchable within a door frame of a container portion, and closes a front access opening through which the wafers are robotically inserted and removed. When the container is fully loaded with wafers the door is inserted into the door frame of the container portion and latched thereto. When seated, cushions on the door provide upward, downward, and inward constraint for the wafers.

The semiconductor industry is now moving toward using even larger, 450 mm diameter, wafers. The larger diameter wafers, although providing cost efficiencies, also provide increased fragility, greater weight, and present undiscovered issues associated with handling and storing the larger wafers in containers made of plastic. Deflection and related problems associated with the expanses of plastic on the top, bottom, sides, front, and back are exacerbated. Assembly of larger components and the manufacturing tolerances of the components being assembled are more problematic. Forces exerted by the increased weight of substrates on the larger components cause more stress, manufacturing tolerances are greater and conventional connection techniques between components may be inadequate or not optimum. For example where in smaller wafer carriers where loads are transmitted from one component to another, often locking structure, such as detents, are putting directly on one component or the other. See, for example, U.S. Pat. No. 7,370,764, illustrating load bearing handles slidingly attachable to shells using detents integral with the handle. This patent is owned by the owner of the instant application. When dealing with greater weights and larger components such configurations may not be optimal.

Wafers of larger dimensions also have significantly greater sag which will make them more susceptible to damage during handling and transport and require unique support not required for smaller wafers. This greater sag presents challenges in maintaining the desired spacing between wafers while still allowing placement and removal of the wafers robotically by robotic arms.

In conventional 300 mm wafer containers, particularly those known as FOSBS (front opening shipping boxes) the front door is latchable to a container portion and closes a front access opening through which the wafers are robotically inserted and removed. When the container is fully loaded with wafers the door is inserted into the door frame of the container portion and latched thereto. In such a configuration the wafers have a first horizontal seating position on the laterally placed shelves and then, upon insertion of the door, the wafers are vertically elevated to a second seating position by wafer supports with angled ramps at the rear of the wafer container as well as wafer supports, often referred to as "cushions", on the inside surface of the door. The container may then be rotated rearwardly 90 degrees to orient the wafers vertically for shipping. See U.S. Pat. Nos. 6,267,245 and 6,010,008 which are owned by the owner of the present application and which are hereby incorporated by reference. The angled ramps are part of V-shaped grooves, with the V rotated 90 degrees, whereby the lower leg of the V engages the wafer edge and rides up the inclination of the lower leg as the door is being inserted, ultimately seating at the inside apex of the V-shaped groove. When seated the cushions on the door then provide upward, downward, and inward constraint. With the greater sag associated with 450 mm wafers, conventional ramps as illustrated in U.S. Pat. No. 6,010,008 may not be optimal.

Along with increasing size of semiconductor wafers, the density of the circuits formed on the wafers has also been increasing, making the circuits more susceptible to defects from smaller and smaller particles and other contaminants. In short, as wafers have increased in size, containers have increased in size as well, and the requirements for keeping the wafers clean and contaminant free have become more stringent due to the wafers being more susceptible to smaller particles and other contaminants.

Accordingly, a need in the industry exists for a wafer container that addresses one or more of these problems, particularly as they exist relative to containers for 450 mm diameter and larger wafers.

SUMMARY OF THE INVENTION

A front opening wafer container comprising a container portion and door particularly for large diameter wafers 300 mm and greater, particularly for 450 mm wafers, utilizes componentry with separate fasteners to lock the componentry together in an expedient manner providing robust connections and cost efficiencies. A container portion has an open front and receives on a bottom surface a base plate secured by twist lock connectors that also provide recesses for purge grommets. Kinematic coupling components readily and robustly lock onto the base plate. Interior wafer support components latch with brackets on the side walls and utilize a separate locking insert with holding tabs and locking detents. A wafer retainer provides support and counters enhanced wafer sag associated with 450 mm wafers when the door is installed and seated.

A wafer retainer is removably attachable on an inside facing surface of the front door and comprises a pair of columns of cantilevered fingers that each depend from a vertical member. Each finger has a fixed or proximate end portion, an intermediate portion and a distal flexing end portion with a exposed wafer engaging surface facing into the wafer container. The finger initially extends horizontally from the vertical member and then at the intermediate portion and end portion extends slightly downward from the horizontal. The exposed wafer engaging surface has a linear recess or groove or valley defined by the junction of an upper surface portion and a lower surface portion. The groove or valley provides a wafer seating groove for when the door is fully seated in the door frame of the container portion. The wafer seating groove at the end portion of each finger is proximate the upper margin of the finger and extends to being approximately in the middle of the finger between the upper margin and lower margin as the wafer seating groove approaches the fixed end portion. The lower surface portion of the exposed wafer engaging surface being wider, in the vertical direction, at the distal end portion of each finger and then narrowing toward the fixed end portion. The wafer retainer further having additional column of fixed wafer seating portions in horizontal alignment with the wafer seating groove.

As the door is inserted into the door frame of the container portion, front edges of the wafers will initially engage each finger, due to the sag of the wafers, at a lower point on the end portion of each finger. As the door is inserted further into the door frame the incline from vertical of each lower surface portion of each finger will urge the forward leading edge of each wafer upwardly, the horizontal extent of the engagement of each wafer with each finger will increase in horizontal width and extend closer to the fixed end portion of each finger as the door is further inserted until the door reaches its seated position. At such point, each wafer will be maximally engaged by the respective finger along most of the wafer engaging groove and will also be engaged by the additional column of fixed wafer seating portions. In an embodiment each wafer will be engaged by the door by two of the fingers and two additional fixed wafer seating portions. Thus, in an embodiment, there are two vertical columns of cantilevered wafer engaging fingers and two columns of fixed wafer seating portions.

In an embodiment, wafer support shelves are secured to the side walls using a combination of cooperating brackets, that is, an insert portion and a pocket portion, one positioned on the shell and one on the back side of the wafer support shelf component, and a three part connection at the front side of the wafer support shelf component. The three part connection comprises a bracket on the wafer shelf component, a cooperating conforming bracket integral with the shell, and a locking member that secures the two brackets together. The locking member is configured as a clip with detents for retaining the clip in position. The clip secures the wafer shelf component to the shell. The detent that secures the components together is not on the two main components but on the component that connects and secures the together. Thus the latch that locks the third component together is substantially isolated for the two main components and substantially isolated from any load transfer between the components. Thus a feature and advantage of embodiments of the invention is a connection assembly for wafer shelves wherein the shelf component is engaged with the shell and a separate component maintains that engagement and has a detent that locks the separate component into a securement position by way of resilient integral tabs.

Additionally, a base plate with kinematic couplings may also be secured utilizing additional fastener components including twist lock connectors that provides a robust connection of the base plate with minimal assembly, minimal particle generation, and allows use of the connections as purge ports. The base plate may utilize snap-in kinematic coupling components that readily and robustly and precisely attach to conforming apertures on the base plate. Again the connector secures the two principal components in engagement with one another such that the load transfer between the two components does not substantially extend through the connecter securing the components.

Thus, a wafer container suitable for use with large wafers, including 450 mm wafers is presented with novel component configuration and attachment means. Said novelty provides enhanced performance, manufacturing expedience and reduced cost.

DESCRIPTION OF THE FIGURES

FIG. 3 is a front elevational cross sectional view of a container portion of a wafer carrier with embodiments of the invention therein taken at line 3-3 of FIG. 1C.

FIG. 3A is a detail cross sectional perspective view of portions of the cross section of FIG. 3. illustrating embodiments of the inventions.

FIG. 3C is a detailed side elevational cross sectional view of a container portion of a wafer carrier with embodiments of the invention therein taken at line 3C-3C of FIG. 1C, along the y-z plane.

FIG. 4A is a perspective view of a wafer support component in accord with embodiments of the inventions herein.

FIG. 4B is a perspective view of a locking clip in accord with embodiments of the inventions herein.

FIG. 5F is a perspective view of a wafer support component with a rearward bracket portion in accord with embodiments of the inventions herein.

FIG. 5G is a perspective view of a wafer support component with a forward bracket in accord with embodiments of the inventions herein.

DETAILED DESCRIPTION

Figure 1A:
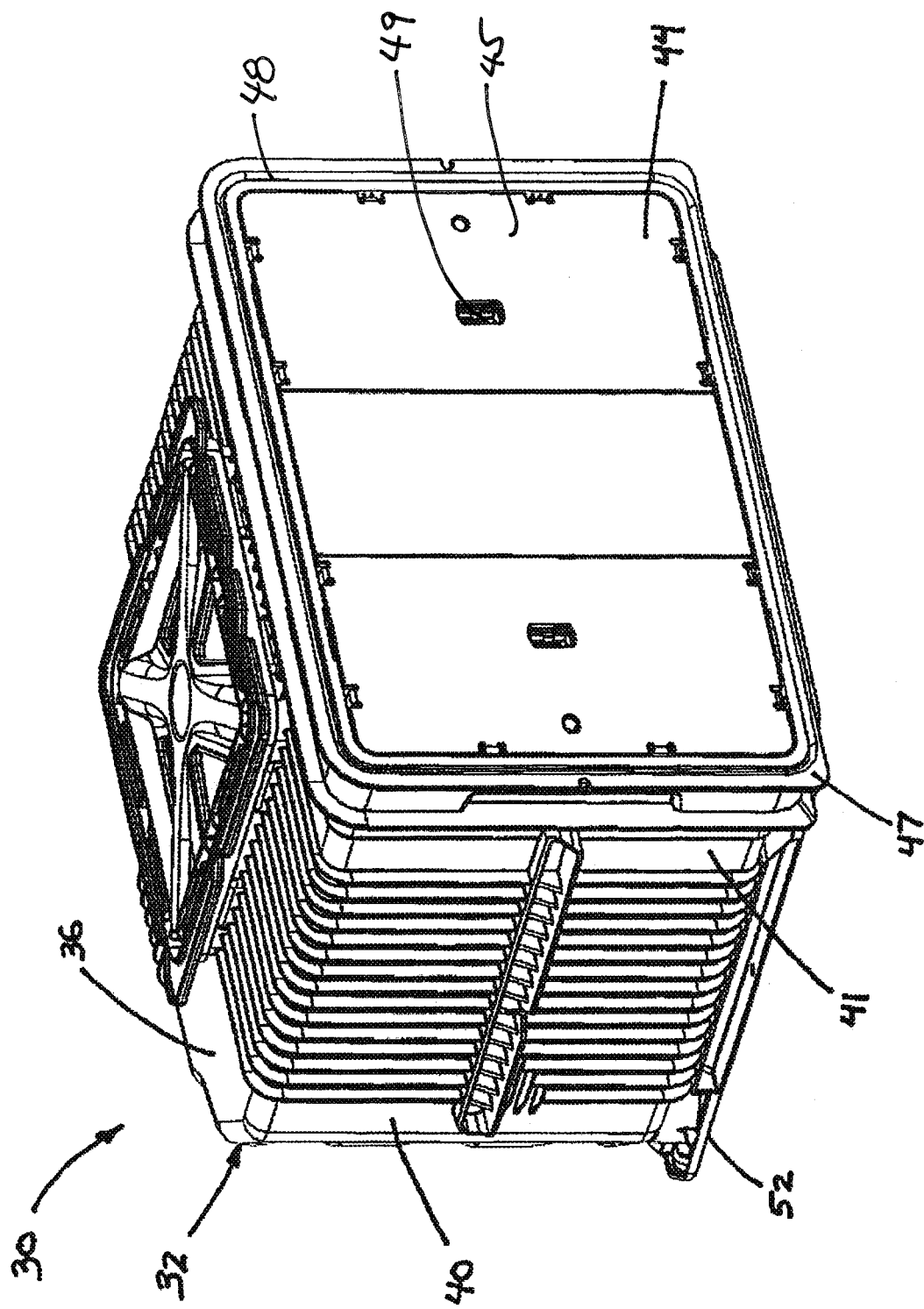
FIG. 1A is a perspective view of a wafer carrier with embodiments of the inventions therein.
Figure 1B:
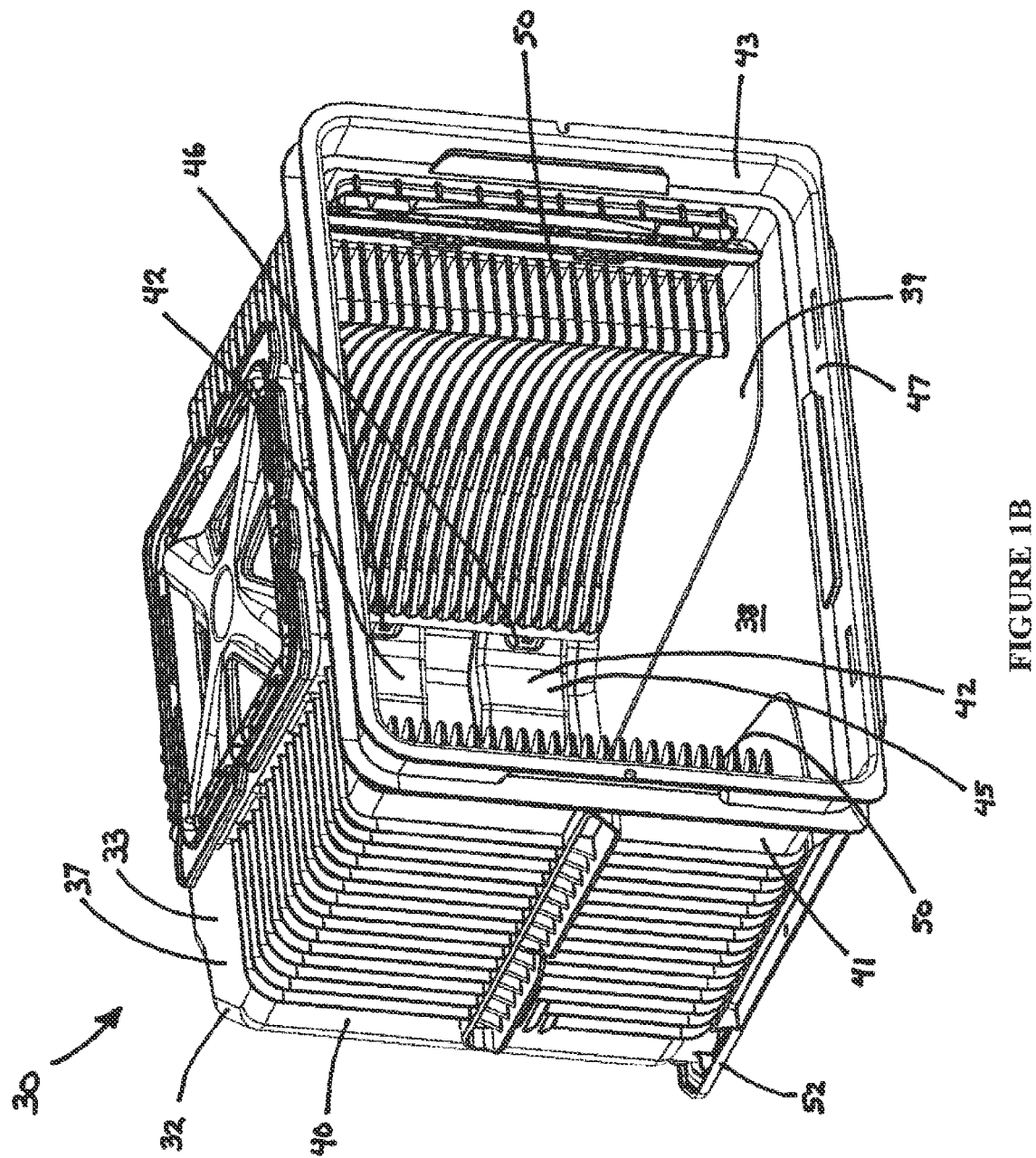
FIG. 1B is a perspective view of the wafer carrier of FIG. 1A with the door removed and illustrating attachment of components embodying the inventions herein.
Figure 1C:
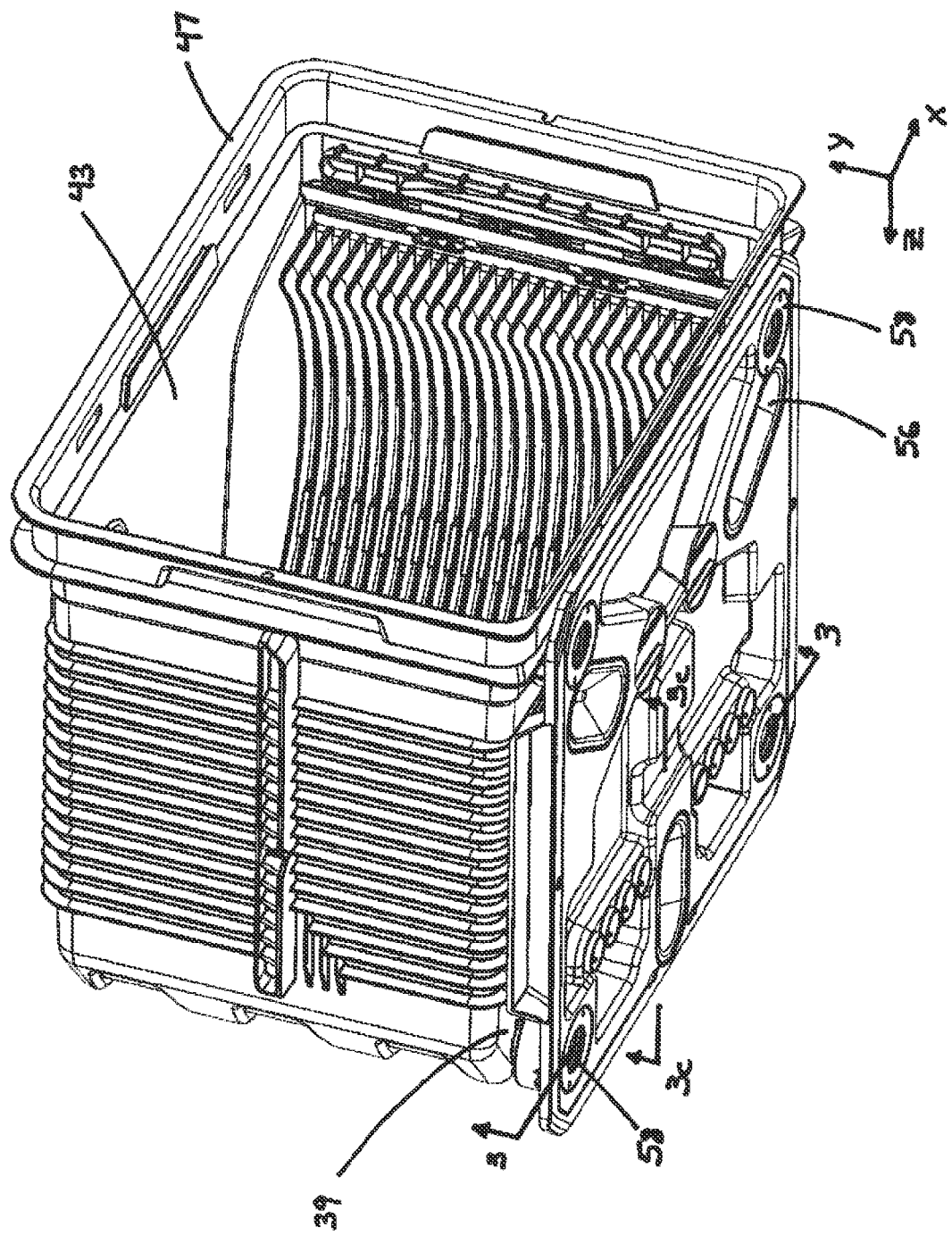
FIG. 1C is a perspective view of the wafer carrier of FIG. 1A with the door removed and illustrating attachment of components embodying the inventions herein.

Referring to FIGS. 1A, 1B and 1C, a multiple application carrier (MAC) 30 is depicted in an embodiment of the invention. The MAC 30 comprises a container portion 32 generally having a shell 33 including an upper portion 36, a top wall 37, a lower portion 38, a bottom wall 39, two side portions 40, two side walls 41, a back wall 42, and a back portion 45. The upper portion 36, lower portion 38 and the two side portions 40 extent toward a front opening 43 configured as a door frame 47 that can be closed and sealed with a door 44 having an outside facing surface 45, a periphery 48, and a latching mechanism 49. In one embodiment, the back portion 42 of the container portion 32 includes a plurality of brackets 46 configured as mounting pockets formed thereon. A pair of wafer support components 50 each have a pair of integrally molded cooperating brackets. The brackets cooperate with brackets on the shell. A locking clip may secure the wafer support component in place. A base plate 52 can be mounted proximate the lower portion 38 on the exterior of the container portion 32. In one embodiment, the base plate 52 includes three kinematic coupling grooves component 56 and a plurality of twist lock connectors 58 that couple the base plate 52 to the lower portion 38 of the container portion 32. The x-y-z coordinate system is illustrated in various figures for directional reference.

Figure 2:
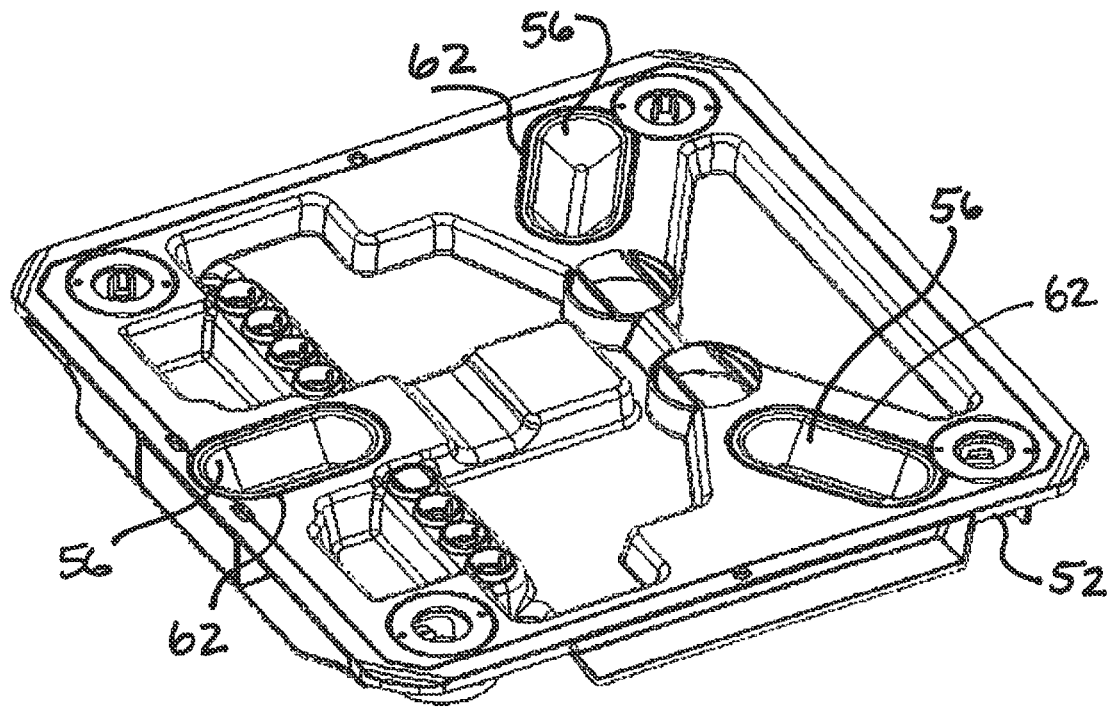
FIG. 2 is a perspective view of the bottom side of a wafer carrier with embodiments of the inventions therein.
Figure 3B:
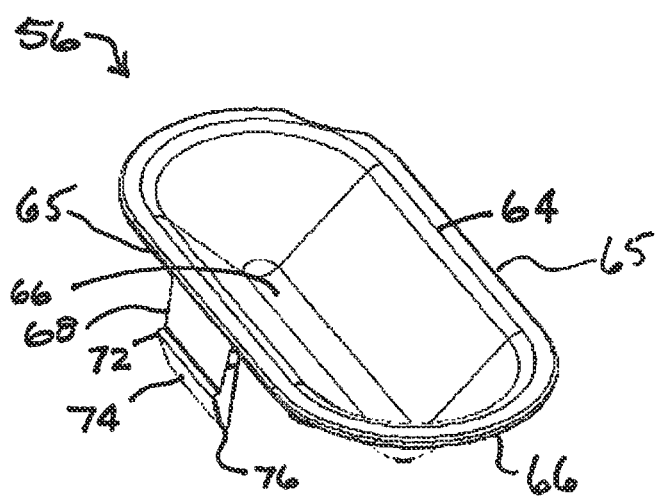
FIG. 3B is a perspective view of a kinematic coupling component in accord with embodiments of the inventions therein.

Referring to FIGS. 2 and 3, the base plate 52 and the kinematic coupling groove component 56 of FIG. 1C are depicted in isolation. The kinematic coupling grooves component 56 are affixed to mounting apertures 62 on the base plate 52 and comprise a rim portion 64 and an apex portion 66 with a continuous, uninterrupted surface defined therebetween. In one embodiment, the rim portion 64 is substantially oval shaped with straight elongate sides 65 and half circular ends 66. A pair of locking projection 68 can be integrally formed to extend from the rim portion 64 of the kinematic coupling groove 56 at the elongate straight sides. In one embodiment, the locking projection 68 includes a barb 72 and a tapered surface 74 on a distal end 76. As illustrated in FIGS. 3, 3A, and 3C, The rim portion at the half circular ends overlays the base plate 52 at an outwardly facing surface 77 and at the elongate straight sides the locking projections catch on an opposite inwardly facing surface 78 of a catch portion 79 of the base plate.

Functionally, the continuous geometry of the kinematic coupling grooves component 56 provides the requisite strength to support the container portion 32 when coupled to fitting projections. The tapered surface 74 of the locking projection(s) 68 enables the kinematic coupling grooves component 56 to be slidingly inserted into the respective mounting apertures 62. The barb 72 defined at the base of each tapered surface 74 is located to engage the respective mounting aperture 62 so that the locking projection 68 snaps into place to secure the kinematic coupling groove 56 to the base plate 52. In one embodiment, the kinematic coupling grooves component 56 cannot be removed from the base plate 52 without first removing the base plate 52 from the container portion 32. This helps prevent the kinematic coupling grooves component 56 from becoming dislodged from or tampered with the mounting apertures 62 inadvertently.

Referring to FIGS. 4A, 4B, 5G, and 5H, one of the wafer support components 50 of FIGS. 1B and 1C is depicted in isolation, along with a clip 82 designed to engage the wafer support component 50 for securing the wafer support component 50 to one of the side walls 41 of the shell 32. The wafer support component 50 includes a front edge 86 and a back edge 88 with a plurality of wafer supports disposed therebetween. The back edge 88 includes a plurality of rear protrusions 90 that extend rearwardly. The rear protrusions 90 are configured to mate with the mounting pockets 46 on the back portion 42 of the container portion 32. The front edge 86 includes a bracket that cooperates with the cooperating bracket 110 on the shell, the wafer support component bracket includes an array of front edge pockets 92

The clip 82 includes a gripping portion 84 with a plurality of retention tabs 98, 100 extending rearwardly therefrom for maintaining the engagement of the wafer support shelf component to the shell and a plurality of locking tabs 101, configured as detents, for securing the clip in place. The retention tabs 98, 100 are configured to mate with the front edge pockets 92 of the wafer support component 50. In the depicted embodiment, some of the retention tabs 100 include a detent 102 proximate a free end 104.

Figure 5A:
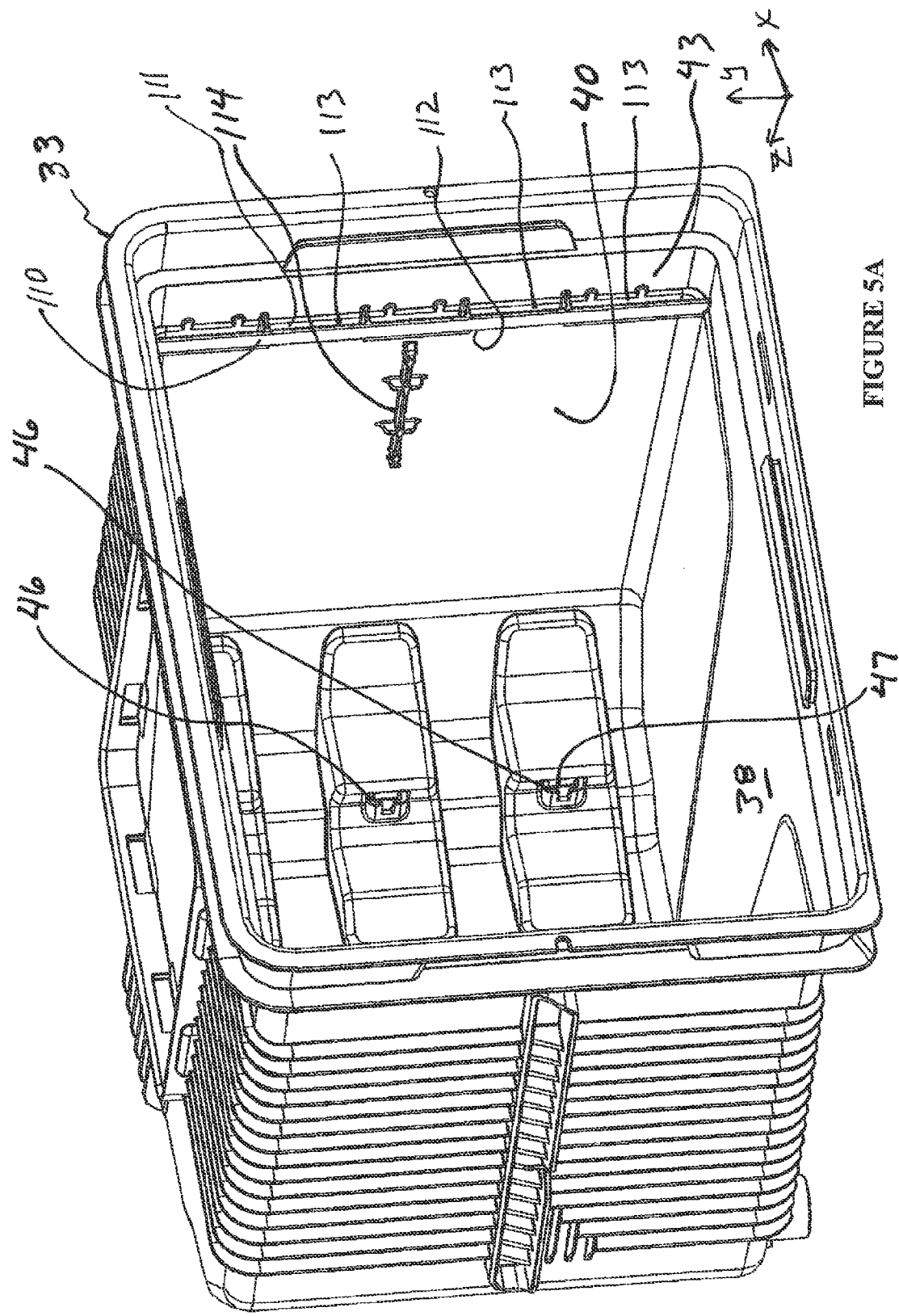
FIG. 5A is a perspective view of a shell of a container portion in accord with embodiments of the inventions herein.
Figure 5B:
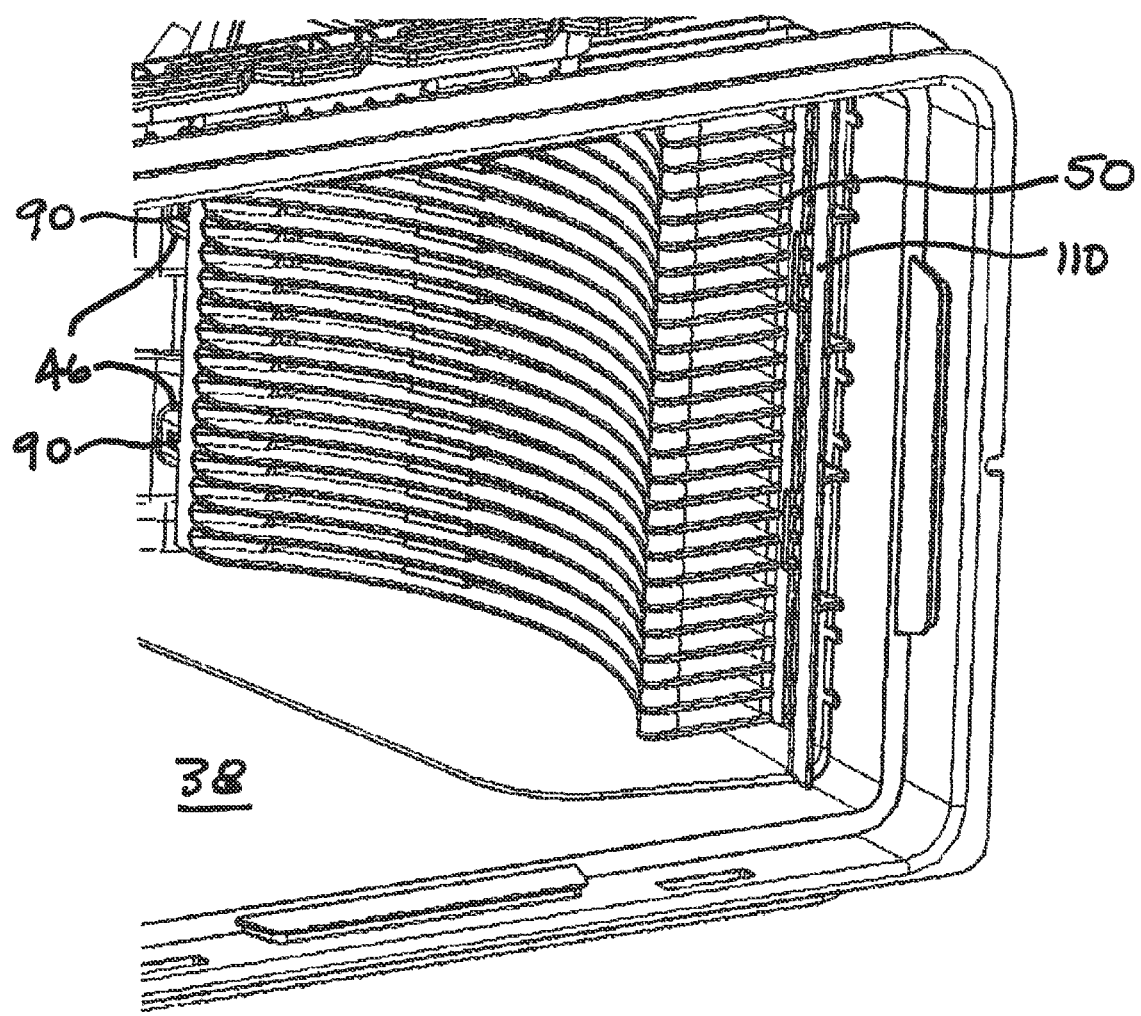
FIG. 5B is a perspective view of the shell of FIG. 5A with a wafer support component inserted therein in accord with embodiments of the inventions herein.
Figure 5C:
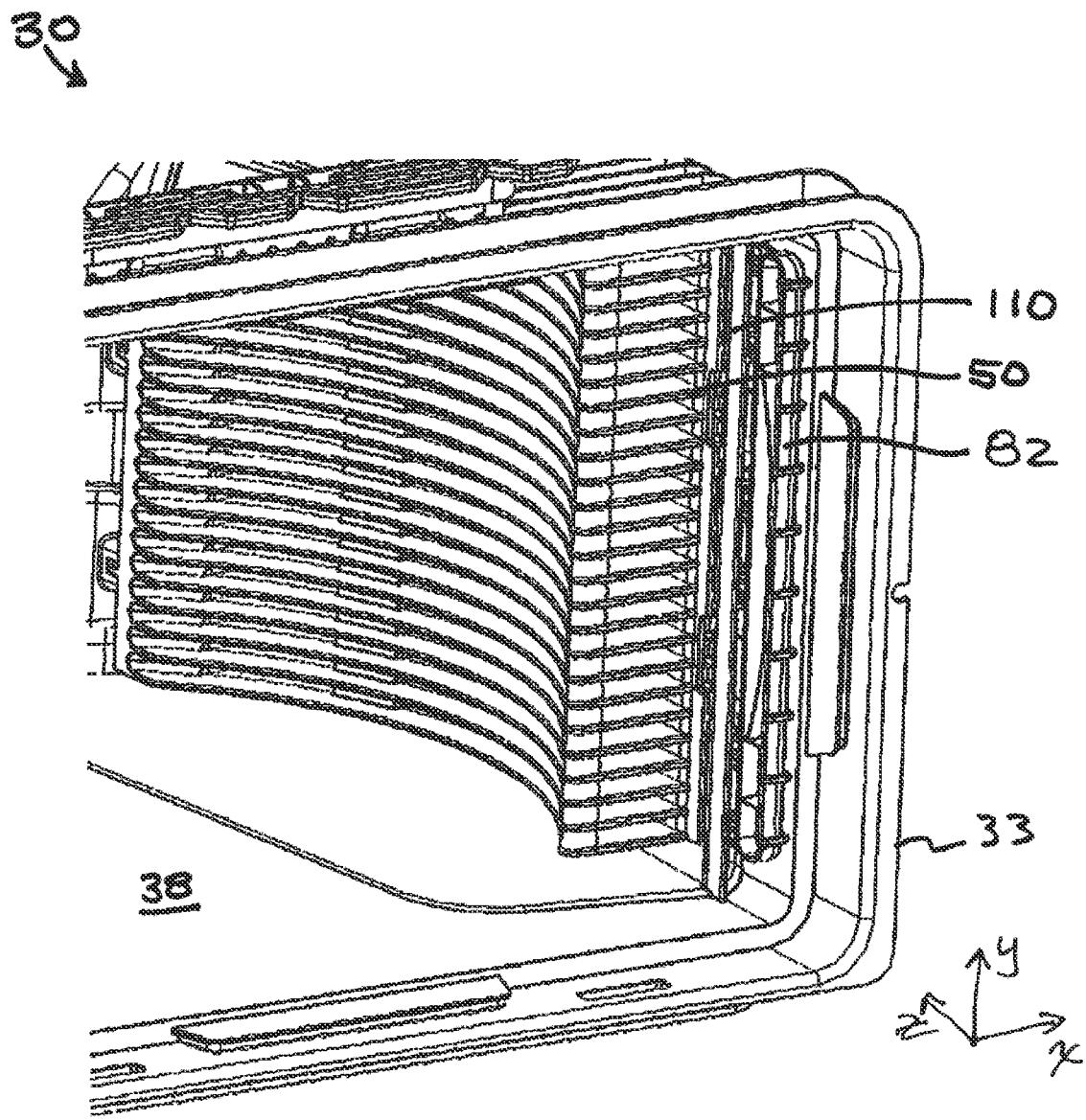
FIG. 5C is a perspective view of the shell of FIGS. 5A and 5B with the wafer support component secured therein with a locking clip in accord with embodiments of the inventions herein.
Figure 5D:
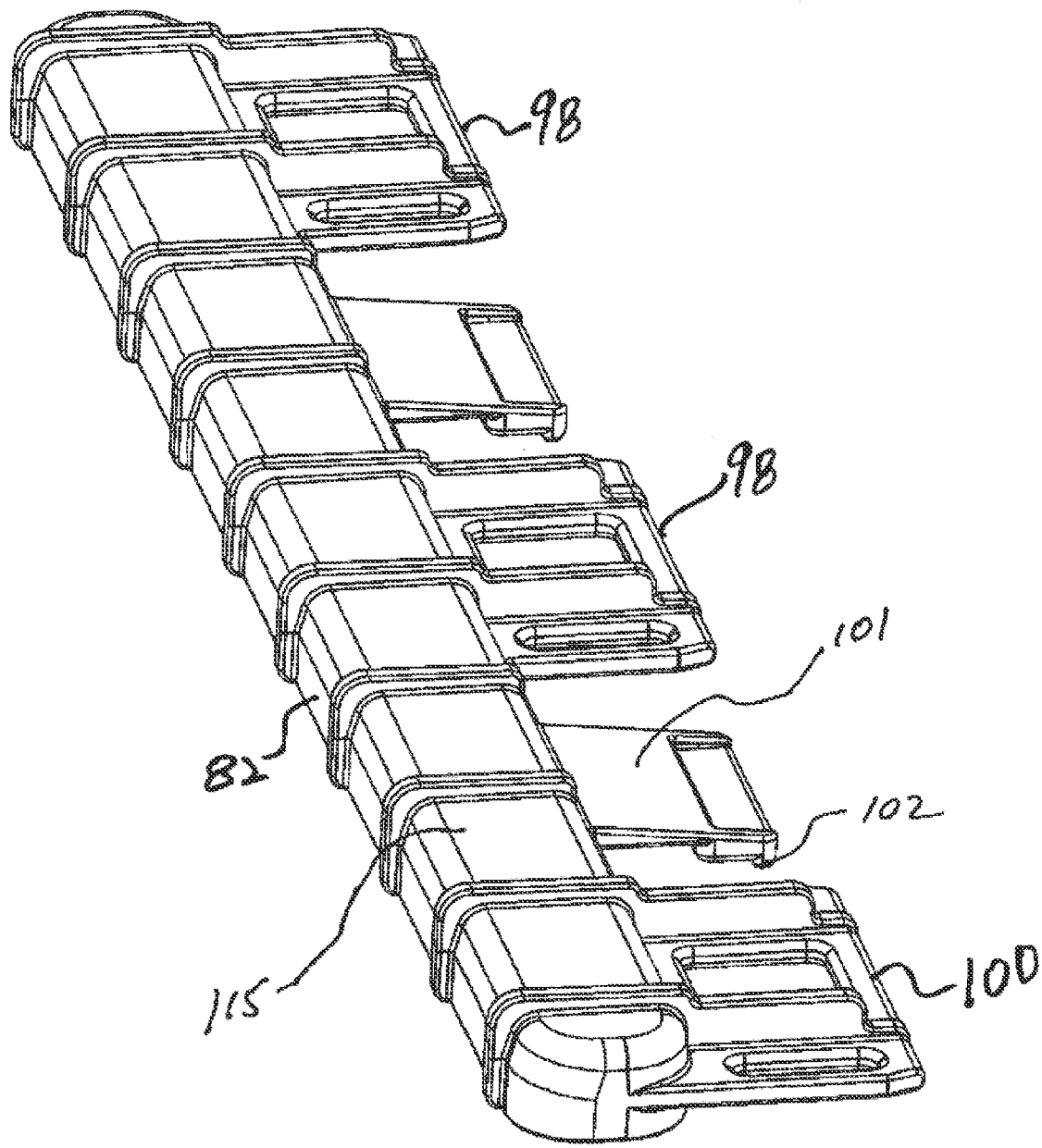
FIG. 5D is a perspective view of a locking clip in accord with embodiments of the inventions herein.
Figure 5E:
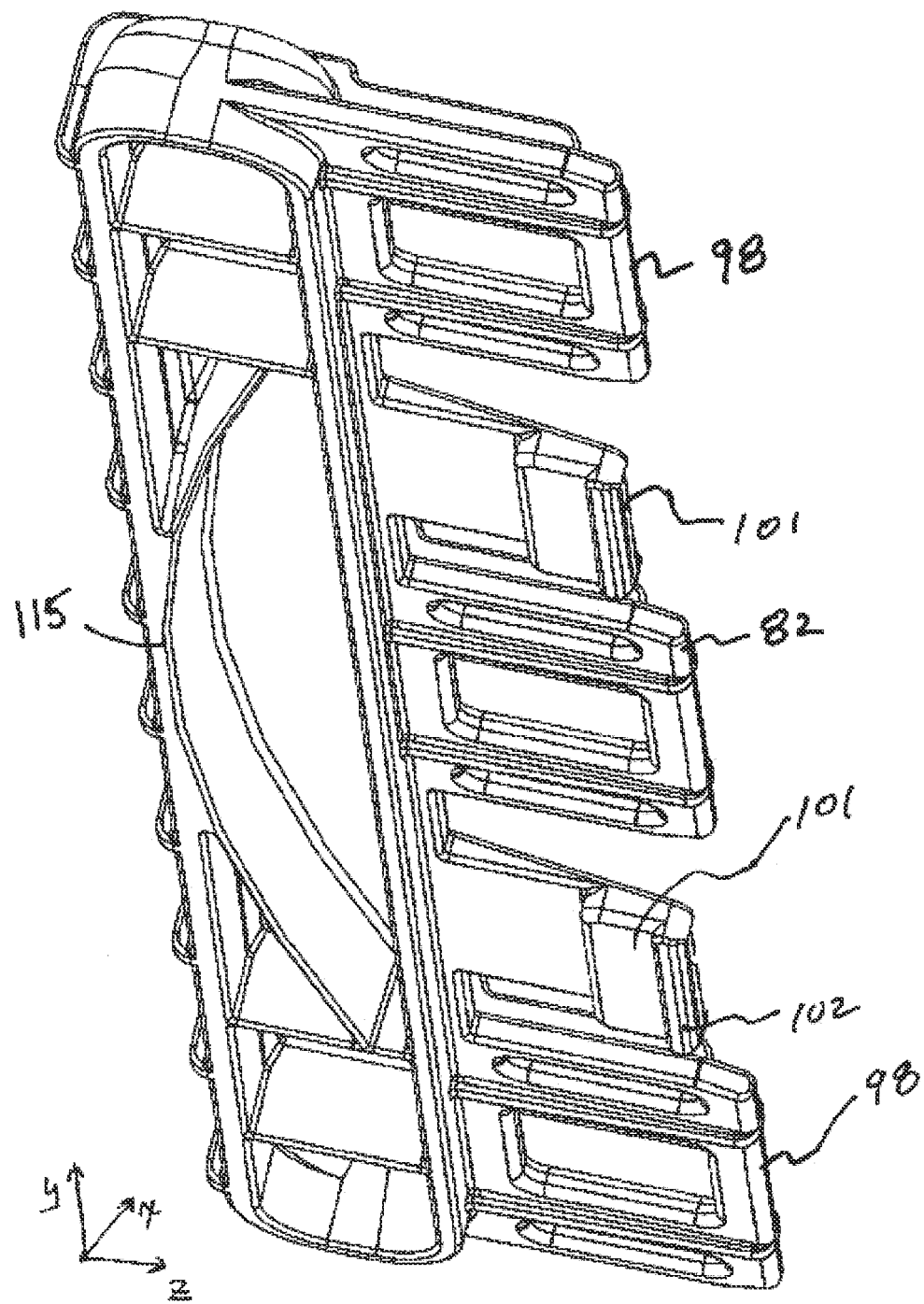
FIG. 5E is a perspective view of an opposite side of the locking clip of FIG. 5d in accord with embodiments of the inventions herein.
Figure 5H:
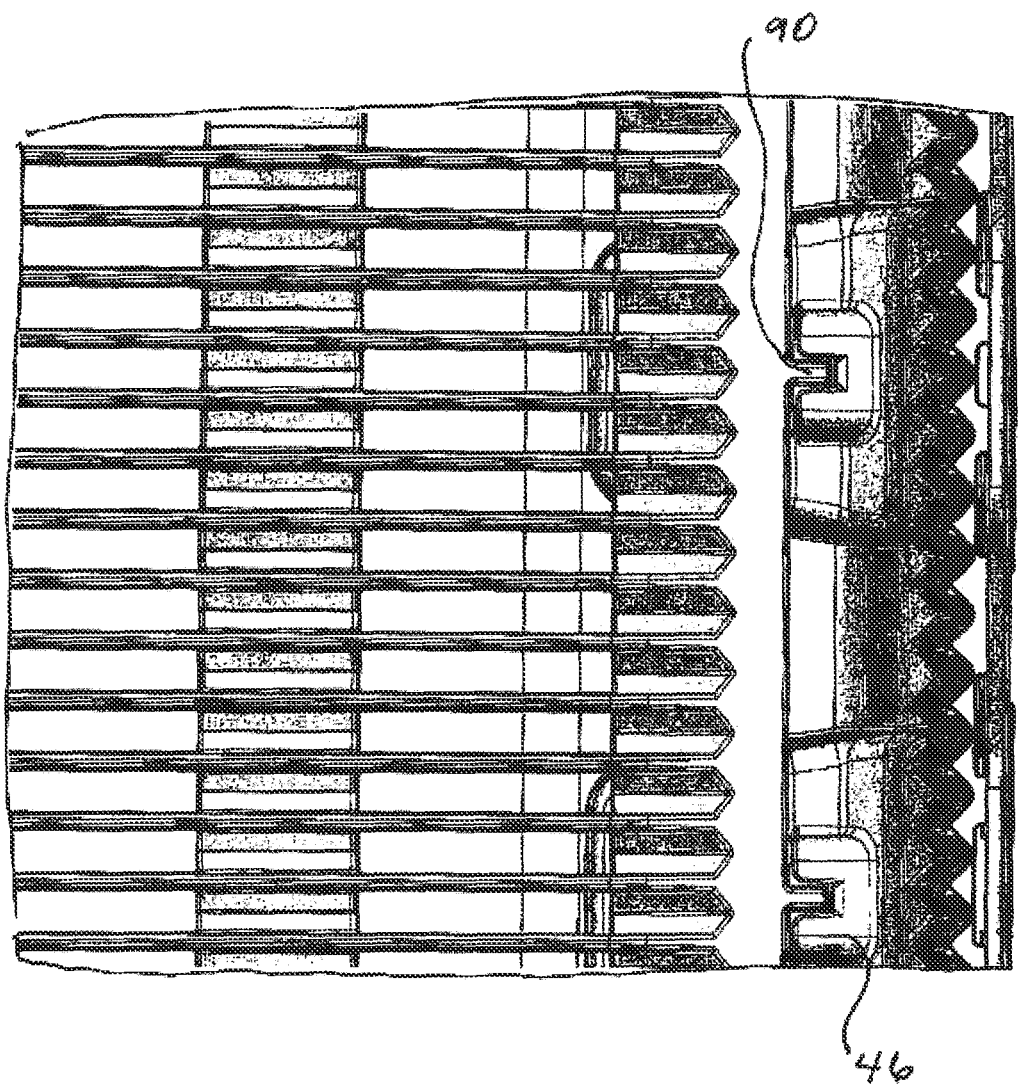
FIG. 5H is a side elevational view inside the container portion illustrating the wafer support component secured to the shell with cooperating bracket in accord with the inventions herein.

Referring to FIGS. 5A through 5C, the MAC 30 is depicted in various stages of assembly. FIGS. 5D through 5H depict the wafer support component configured as a shelf assembly 50 and further depict a locking insert or clip 82. The depiction of FIG. 5A presents the container portion 32 with one of the wafer support assemblies 50 removed. Two of the brackets configured as mounting pockets 46 with receiving recesses 47 are visible in this view. The FIG. 5A also depicts a mounting bracket 110 that can be integrally formed on or otherwise attached to the side portion 40, the mounting bracket 110 including a rearward edge 112 and defining a number of openings 113 that are adjacent to the side wall 41. A further side bracket 114 integrally molded with the shell is also received by cooperating feature 115 configured as a slot in the wafer support component 50.

In assembly, the wafer support component 50 is positioned proximate one of the side portions 40 and cooperating brackets are engaged, specifically the rear protrusions 90 of the wafer support component 50 is inserted into the mounting pockets 46 of the back portion 42 of the container portion 32, as depicted in FIG. 5B. The front edge 86 of wafer support component 50 is rotated into position about a vertical axis in the y direction, whereby the front of the wafer support component is adjacent the side wall 41 immediately behind the mounting bracket 110. With the wafer support component 50 so positioned, the clip 82 is inserted into the mounting bracket 110 so that the retention tabs 98, 100 extend through the mounting bracket 110 apertures 111 and into the front edge pockets 92 of the wafer support component 50, as depicted in FIG. 5C. When the locking clip 82 is fully inserted, the retention tabs 100 with the detents 102 snap into place so that the detents 102 engage the rearward edge 112 of the mounting bracket 110 or a rearward edge of the bracket of the wafer support shelves. The locking clip may be manually inserted and removed utilizing the handle portion 115.

In one embodiment, one of the mounting pockets 46 and/or rear protrusions 90 can be dimensioned for a close tolerance fit, while the remaining mounting pockets 46 and/or rear protrusions 90 are dimensioned for a looser fit. The close tolerance fit can provide registration for the wafer support component 50 relative to the back portion 42, while the remaining, looser fitting mounting pockets 46 and rear protrusions 90 provide stability. For example, in the depicted embodiment, there are three mounting pockets 46 on the back portion 42 that mate with three rear protrusions 90 on the wafer support component 50. The center mounting pocket 46 and rear protrusion 90 can be closely toleranced to provide a tight fit, while the upper and lower mounting pockets 46 and respective rear protrusions 90 are loose fitting. The loose fit of the upper and lower combinations still provide pitch, yaw and roll stability to prevent undue bending stress to be imparted on the central mounting pocket 46/rear protrusion 90 combination. This arrangement provides for easier mounting of the wafer support component 50 into the plurality of mounting pockets 46 because only the close tolerance mounting pocket 46/rear protrusion 90 combination needs to be carefully aligned.

Figure 6:
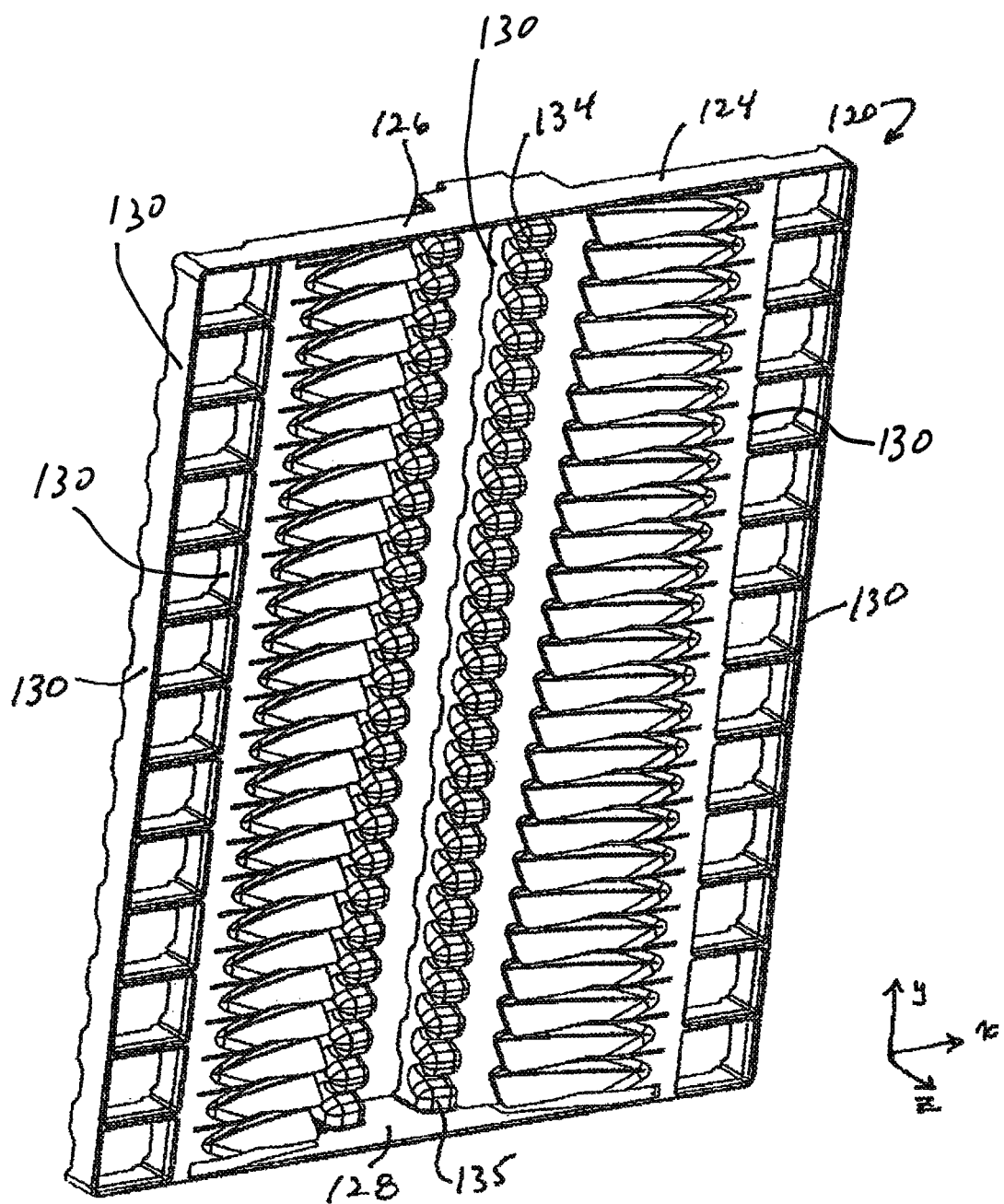
FIG. 6 is a perspective view of the wafer engaging side of a wafer restraint attachable to the inside surface of the front door in accord with embodiments of the inventions.
Figure 6A:
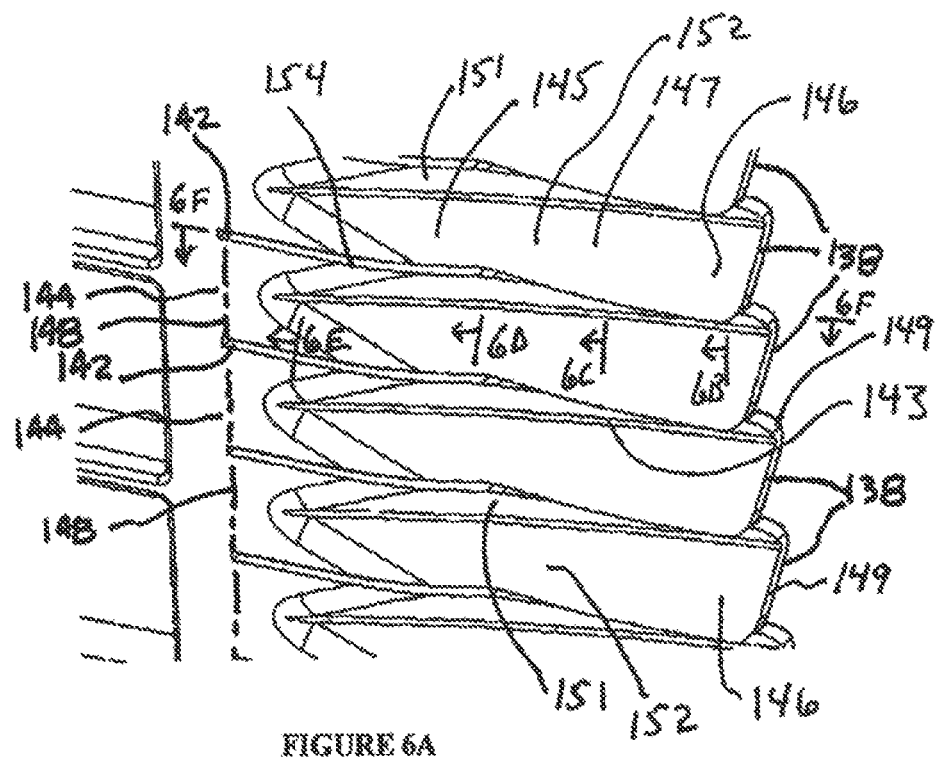
FIG. 6A is a perspective view of cantilevered fingers of the wafer restraint of FIG. 6.
Figure 6F:
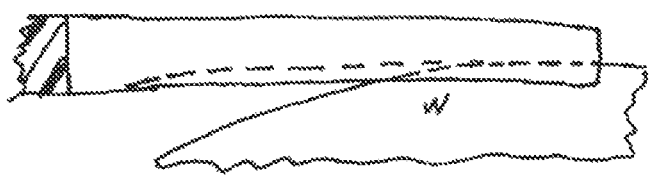
FIGS. 6F-6H illustrate in schematic views in a plan view cross section taken at line 6F-6F of FIG. 6A the progressive engagement of a wafer with a cantilevered finger in accord with embodiments of the inventions.
Figure 6G:
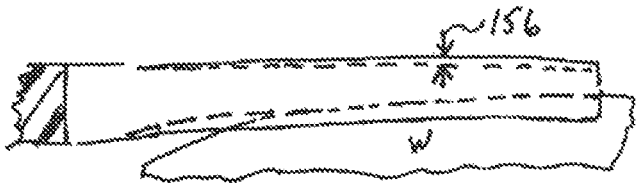
Figure 6H:
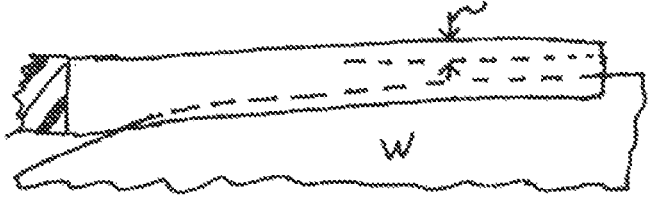
Figure 6I:
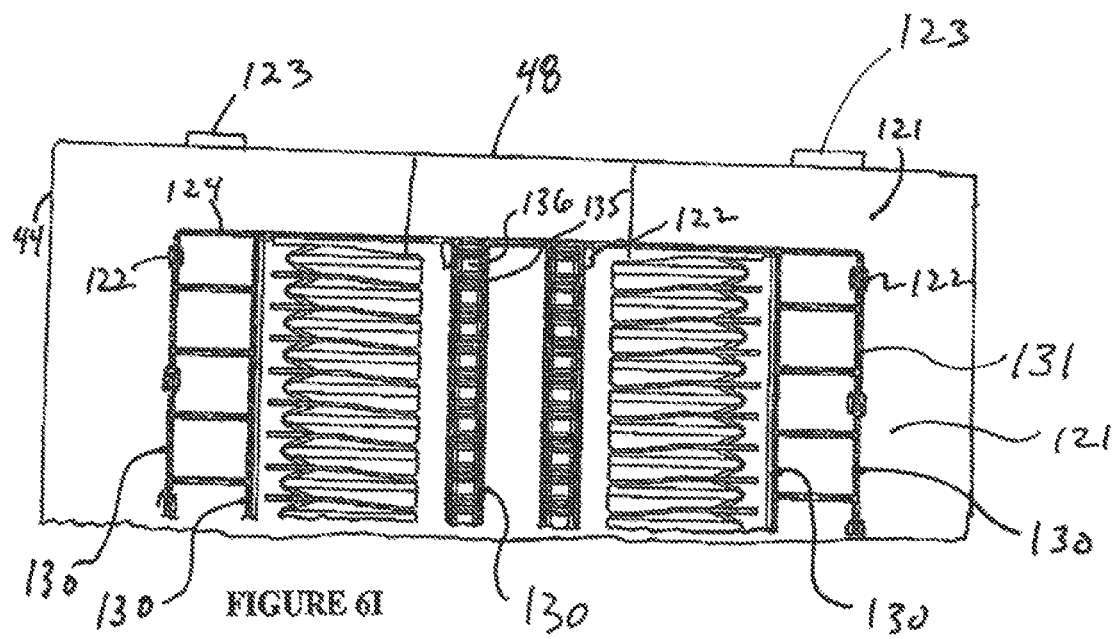
FIG. 6I is an elevational view of the inside surface of the front door with a wafer restraint in place in accord with embodiments of the inventions.
Figures 6B, 6C, 6D, 6E:
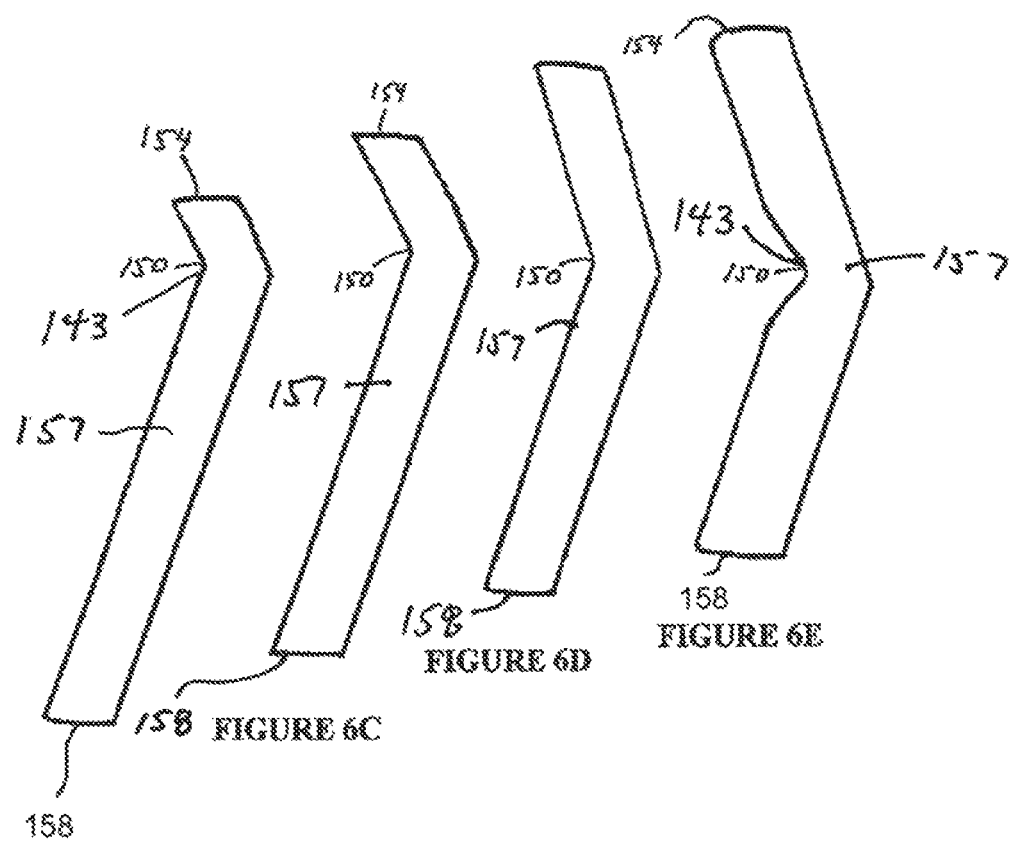
FIGS. 6B-6E are side schematic views of the relative thicknesses and configurations of various cross sections of a cantilevered finger taken at the respective lines of FIG. 6A.

Referring to FIGS. 6 through 6I, a wafer retainer 120 is depicted in an embodiment of the invention. The wafer retainer 120 is mounted on the inside surface 121 of the door 44 utilizing conventional means such as bosses 122 extending from the door. Latching portions 123 extend from the door periphery 48. The wafer retainer includes a substantially rectangular outer frame 124 having an upper horizontal frame member 126 and a lower horizontal frame member 128 and four vertical support members 130 generally defining a rectangular framework 131 to be received by the inside wall surface of the door. At least one guide block 134 spans between the upper member 126 and the lower member 128. A plurality of cantilevered fingers 138 extend from each of the side members in cantilevered fashion toward the guide block(s) 134. The guide block comprise one or two vertical support members with a column of non cantilevered fixed wafer supports 135 each defining a seating position 136 for each of the forward edges of the wafers when the door is fully seated in the door frame.

A slot 142 is defined between each pair of adjacent cantilevered fingers 138, the slots 142 terminating at fixed end portions 144 of the cantilevered fingers 138. Each cantilevered finger 138 is substantially flat and of substantially uniform thickness at the fixed end portions 144. The cantilevered finger 138 takes on an angled shape at locations distal to the fixed end portions 144, defining an angle or groove 143.

Functionally, the flatness of the fixed end portions 144 of the cantilevered fingers 138 is more conducive to bending than the angle-shaped portions of the cantilevered fingers 138 that are distal to the fixed end portions 144. Accordingly, the fixed end portions 144 can act as a living hinge when a wafer or substrate engages the respective cantilevered finger 138. The fixed end portions extend to and support an intermediate portion 145 and then the flexing distal end portion 146. By this design, in one embodiment each cantilevered finger 138 generally flexes about a respective axis 148 that extends between the termination points, the distal tips 149 of the slots 142 on either side of the cantilevered finger 138, while the finger itself remains comparatively rigid.

In this way, the cantilevered fingers 138 can be shaped to substantially match the radius of the outer edge of the wafer or substrate that is being retained particularly when the door is seated. The angle surface defined on the cantilevered fingers 138 also aids in guiding and centering the wafers on the cantilevered fingers 138.

Each finger has the fixed or proximate end portion 144, an intermediate portion 145, and a distal flexing end portion 146 with a exposed wafer engaging surface 147 facing into the wafer container, that is away from the door. The finger initially extends horizontally from the vertical member and then at the intermediate portion 145 and end portion 146 extends slightly downward from the horizontal. The exposed wafer engaging surface has a linear recess defining the wafer receiving groove portion 143 or valley with the apex 150 of the groove portion defining the junction of an upper surface portion 151 and a lower surface portion 152 of the exposed wafer engaging surface. The groove portion 143 or valley providing a wafer seating groove for when the door is fully seated in the door frame of the container portion. The wafer seating groove portion 150 at the end portion of each finger is proximate the upper edge portion 154 or margin of the finger and extends to being approximately at a middle portion 157 of the finger between the upper edge portion and lower edge portion 158 as the wafer seating groove approaches the fixed end portion, see FIGS. 6F-6G illustrating the progressive engagement of the wafer W as the cantileved finger is deflected from it original positions, shown in dashed lines, as indicated by the double arrows 156. The lower surface portion of the exposed wafer engaging surface being wider, in the vertical direction, at the distal end portion of each finger and then narrowing toward the fixed end portion.

As discussed above, the retainer further having one or two additional columns of fixed wafer seating portions in horizontal alignment with the wafer seating groove.

As the door is inserted into the door frame of the container portion, front edges of the wafers will initially engage each finger, due to the sag of the wafers, at a lower point on the distal end portion of each finger. As the door is inserted further into the door frame the incline from vertical of each lower surface portion of each finger will urge the forward leading edge of each wafer upwardly, the horizontal extent of the engagement of each wafer with each finger will increase in horizontal width and extend closer to the fixed end portion of each finger as the door is further inserted until the door reaches its seated position. At such point, each wafer will be maximally engaged by the respective finger along most of the wafer engaging groove and will also be engaged by the additional column of fixed wafer seating portions. In an embodiment each wafer will be engaged by the door by two of the fingers and two additional fixed wafer seating portions. Thus, in an embodiment, there are two vertical columns of cantilevered wafer engaging fingers and two columns of fixed wafer seating portions.

The downward tilt of the distal end portions of the cantilevered fingers is also illustrated in FIG. 6I where the wafer retainer is installed on the inside surface 121 of a front door.

Figure 7A:
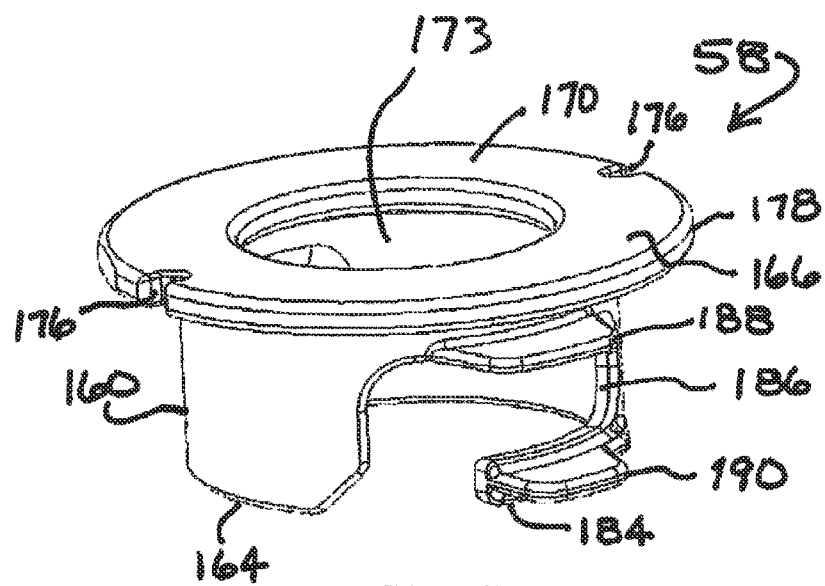
FIG. 7A is a perspective view of a twist lock connector that locks in less than one half turn in accord with embodiments of the inventions herein.
Figure 7B:
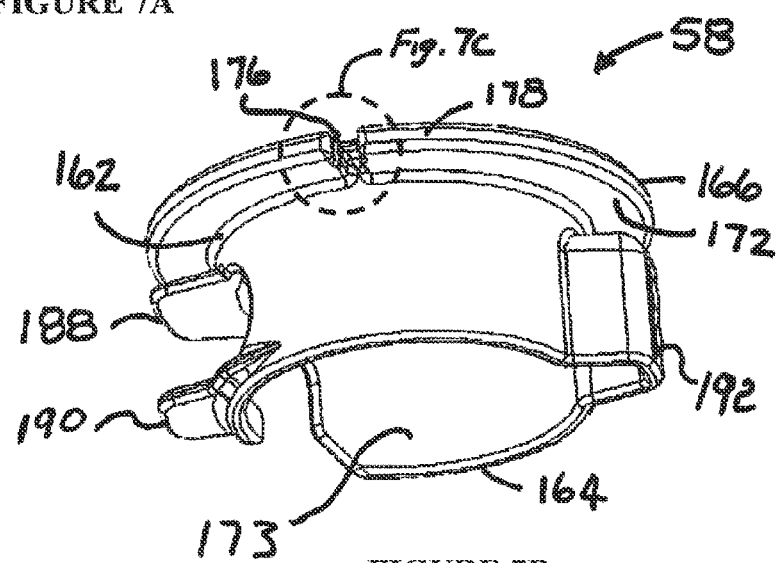
FIG. 7B is a perspective view of the twist lock connector of FIG. 7A from the opposite side and looking upwardly in accord with embodiments of the inventions.
Figure 7C:
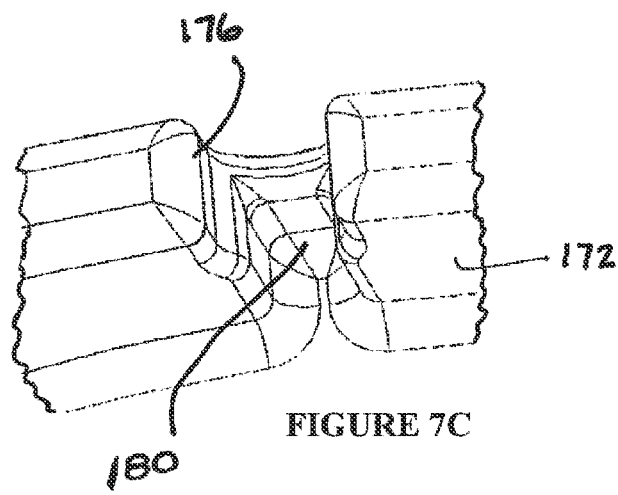
FIG. 7C is a perspective view of a notch or groove on the twist lock connector of FIG. 7A.

Referring to FIGS. 7A through 7C, one of the twist lock connectors 58 is depicted in an embodiment of the invention. A function of the twist lock connector is to secure the base plate 52 to the container not utilizing threads and using a partial rotation of less than 180 degrees. In another embodiment utilizing a rotation of about 90 degrees. Additionally the connectors may in embodiments provide an access port. The twist lock connector 58 of the depicted embodiment comprises a substantially cylindrical body 160 with a flanged end 162 and a flangeless end 164, with a flange 166 of the flanged end 162 having a superior or outward-facing surface 170 and an inferior or inward-facing surface 172. The cylindrical body 160 defines an interior through port 173. The flange 166 can include holes or notches 176 at or near an outer perimeter 178 of the flange 166. In one embodiment, the notches 176 are formed so that only a portion of the notch 176 is accessible from the outward-facing surface 170, with the remainder of the notch 176 forming a recess 180 accessible from the inward-facing surface 172 (FIG. 7C).

The twist lock connector 58 can also include an arcuate arm 184 formed proximate the flangeless end 164 of the cylindrical body 160. The arcuate arm 184 defines a tangential slot 186 that is accessible from the flangeless end 164. In one embodiment, a superior or outward tab 188 extends radially from the cylindrical body 160 and an inferior or inward tab 190 extends radially from the arcuate arm 184, the tabs being located on opposing sides of the tangential slot 186. The twist lock connector 58 can further include a boss 192 on the cylindrical body 160. In the depicted embodiment, the boss 192 is substantially diametrically opposed to the tangential slot 186.

Figure 8:
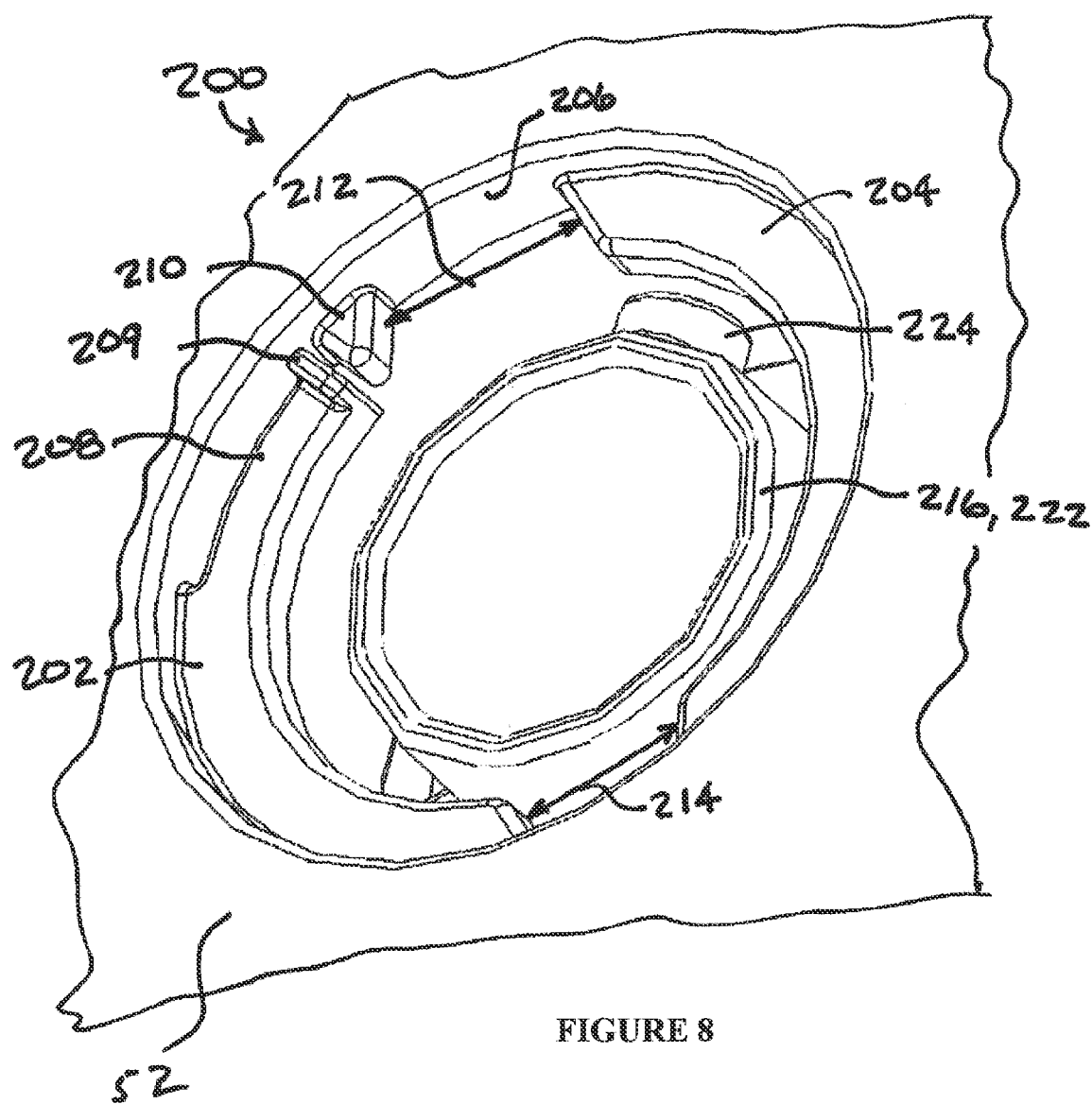
FIG. 8 is a perspective view of the bottom side of a base plate with a boss unitary with the shell exposed therein in accord with embodiments of the inventions herein.

Referring to FIG. 8, a locking port 200 located on the base plate 52 is depicted in an embodiment of the invention. The locking port 200 is designed to selectively mate with the twist lock connector 58. The locking port 200 can include opposing interior flanges 202, 204 on an interior perimeter 206 of the locking port 200. In one embodiment, at least one of the interior flanges 202 defines a locking arm 208 that extends tangentially from the interior flange 202 in cantilevered fashion with a detent 209 located proximate the free end of the locking arm 208. A protrusion 210 can also be located proximate the free end of the locking arm 208. The interior flanges 202, 204 and protrusion 210 define a first gap 212 and a second gap 214.

Figure 9A:
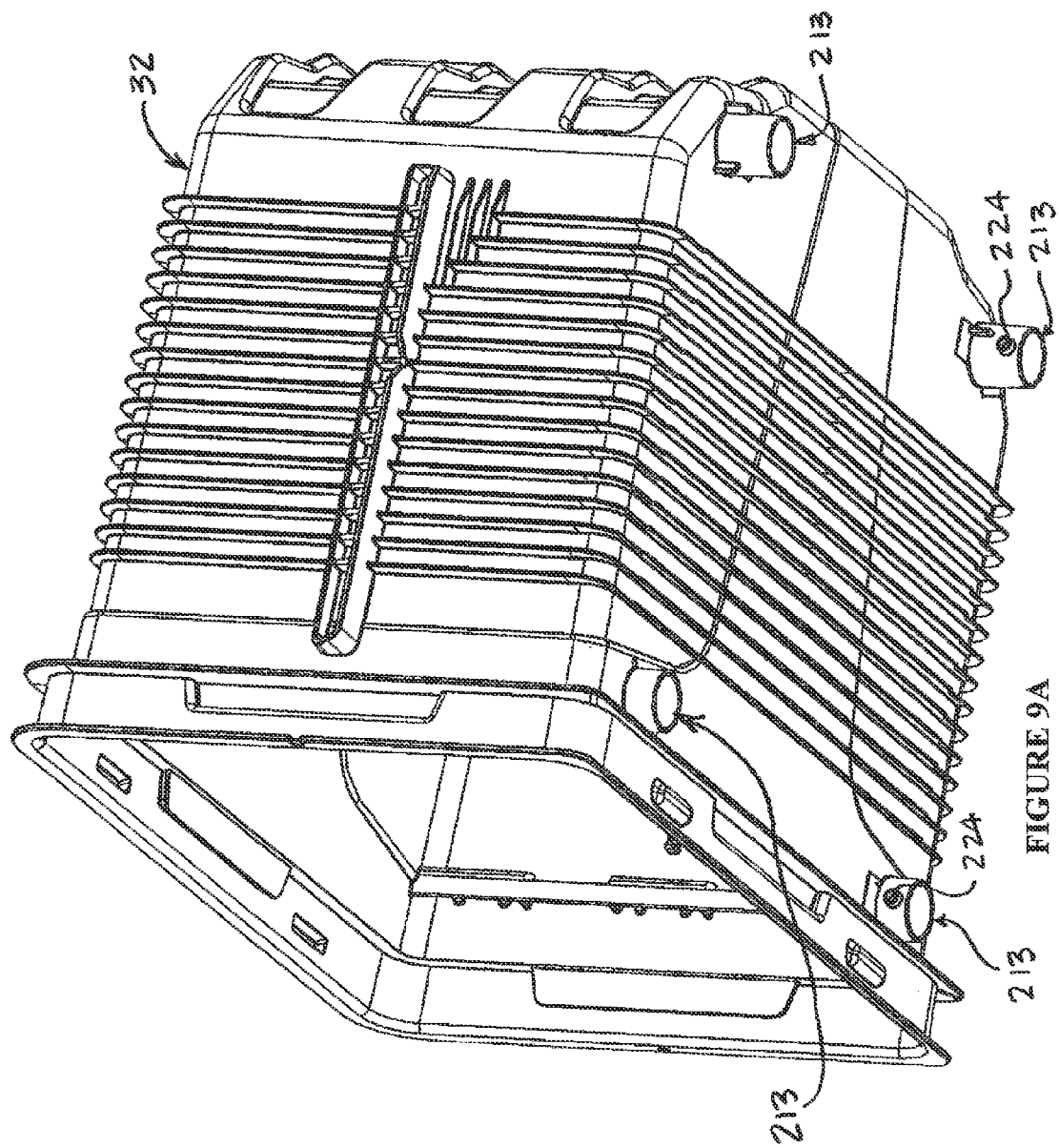
FIG. 9A is a perspective view of a shell of a container portion illustrating unitary bosses extending from the lower wall in accord with embodiments of the inventions.
Figure 9B:
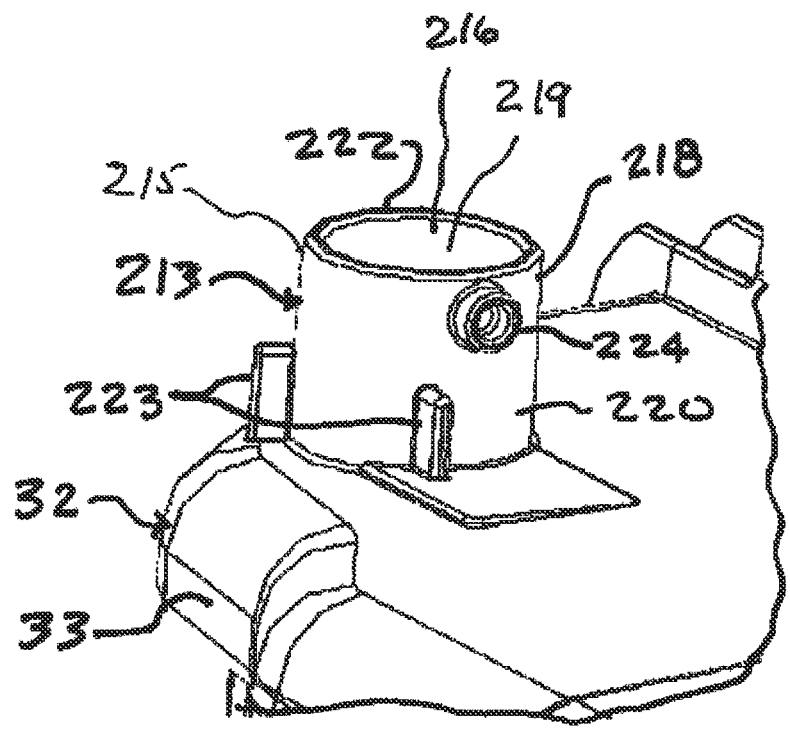
FIG. 9B is a perspective view detailed view of a boss on the bottom of the shell of FIG. 9A. For viewing convenience the shell has been inverted for this figure.

Referring to FIGS. 9A and 9B, male fastening members 213 are depicted in an embodiment of the invention. The male fastening member 213 can be configured as tubular boss 215 extends from the bottom of the container portion. In one embodiment of the invention, the boss 215 is integrally formed with the shell of the container portion, that is, unitary with the shell which may be configured as a purge or access port 216 of the container portion 32 is depicted in an embodiment of the invention. In other embodiments the fastening member may be a flanged member positioned in an hole through the shell 33. In an embodiment, where the connector is associated with an access port, the boss has a passageway 219 that is in fluid communication with the interior of the container portion 32. Any or all of the four connectors as illustrated may be associated with access ports. The access port 216 can be further characterized as having a base portion 220 and a free end 222, and can include gussets 223 that extend from the lower portion 38 of the container along the base portion 220 of the fastening member 213. In the depicted embodiment, the access port 216 also includes a secondary boss, protrusion, or pin 224 that extends radially outward from the body 218 proximate the free end 222.

Figure 9C:
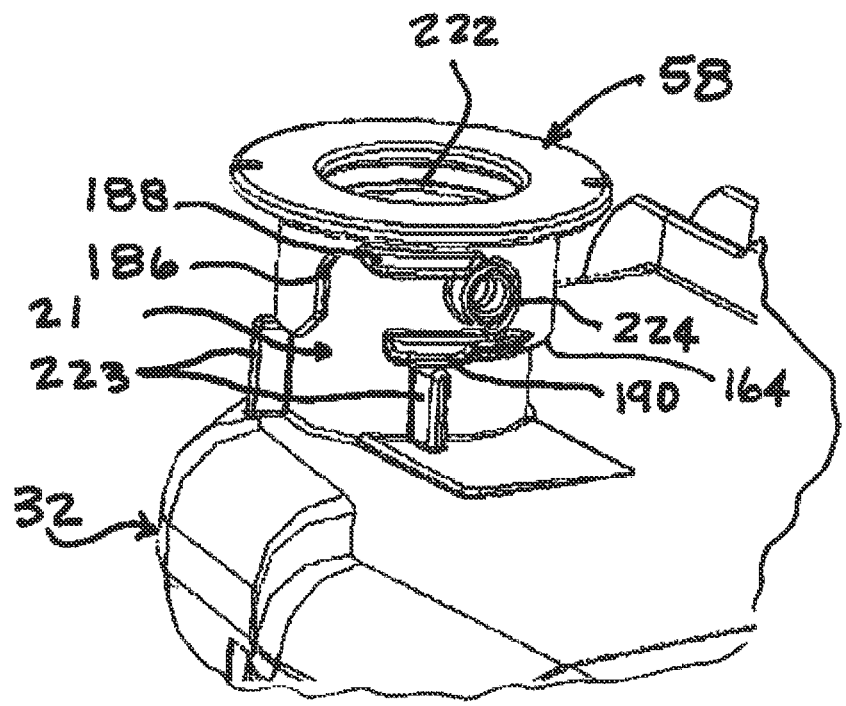
FIG. 9C is a perspective view detailed view of the boss of FIG. 9B with a twist lock connector in accord with embodiments of the inventions herein.

Referring to FIG. 9C, the coupling of the twist lock connector 58 to the access port 216 is depicted in an embodiment of the invention. (The base plate 52 has been removed from FIGS. 9A through 9C for clarity of the interaction between the twist lock connector 58 and the access port 216. In operation, the base plate 52 would be included.) The protrusion 224 of the access port 216 cooperates with the tangential slot 186 of the twist lock connector 58 to provide a bayonet-style connection. In one embodiment, the flangeless end 164 of the twist lock connector 58 registers against the ends of the gussets 223.

Figure 9D:
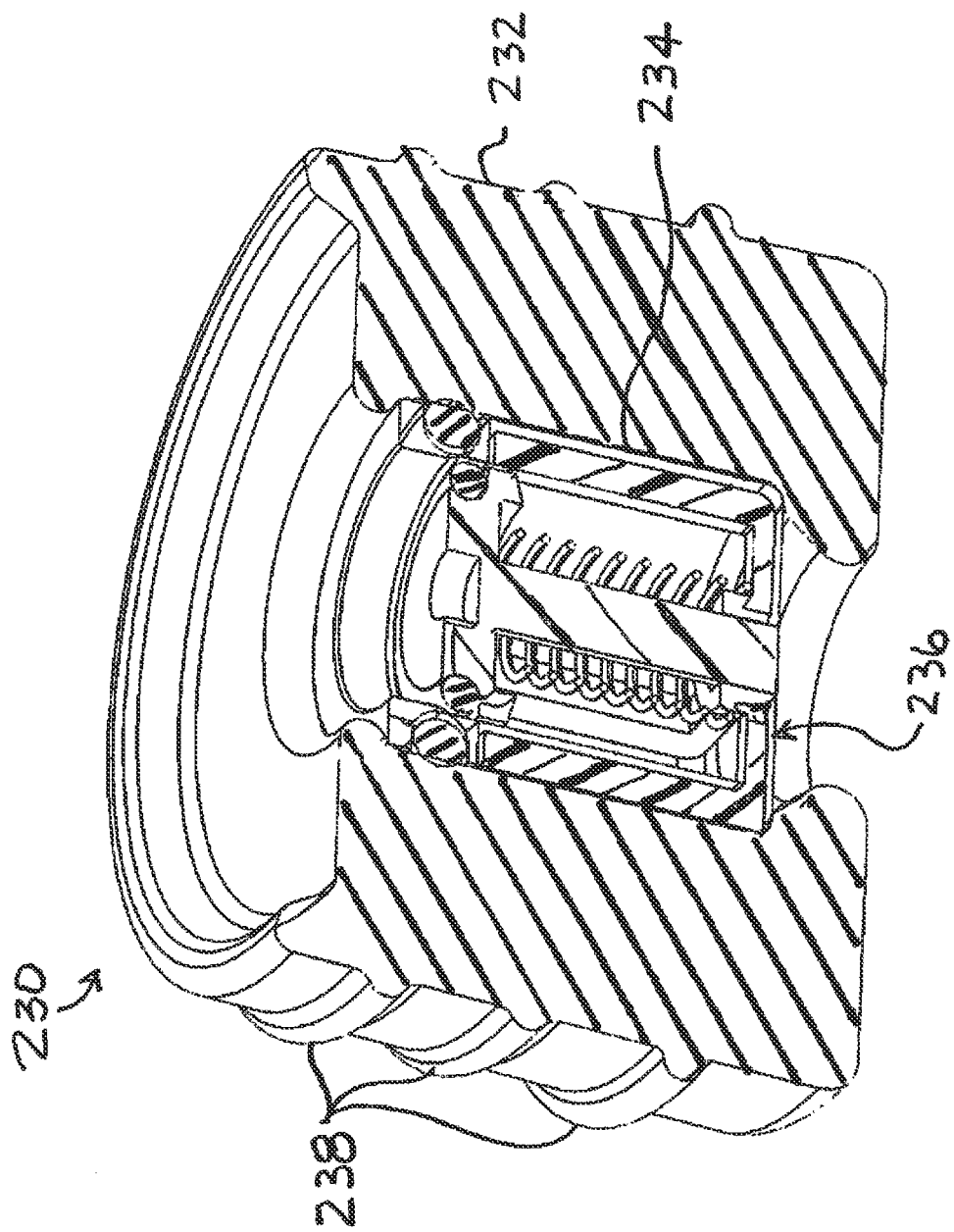
FIG. 9D is a cross sectional view of a elastomeric grommet with a check valve therein suitable for use in the connectors and bosses that are used as purge ports.

Referring to FIG. 9D, a purge valve 230 is depicted for use with embodiments of the invention. The purge valve 230 can comprise a grommet 232 having a passageway 234 that houses a check valve 236 for control of flow through the passageway 234. The grommet 232 can also include exterior ribs 238 to facilitate sealing and friction fit of the grommet 232 within the access port 216 of the fastening member 213. Any of a number of purge valves or grommets can be utilized within the access port 216, such as, for example, found in U.S. Pat. No. 7,328,727 to Tieben et al., the disclosure of which is hereby incorporated by reference herein in its entirety except for express definitions contained therein.

Figure 10A:
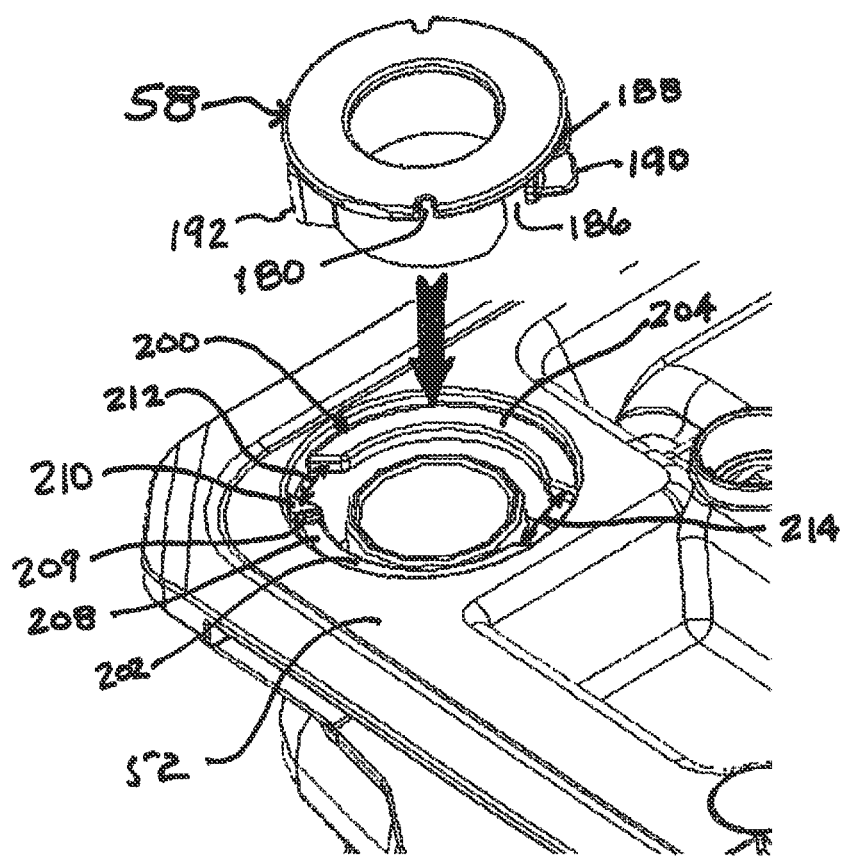
FIGS. 10A and 10B are views illustrating the attachment of a connector to a boss extending from a shell sandwiching the base plate therebetween.
Figure 10B:
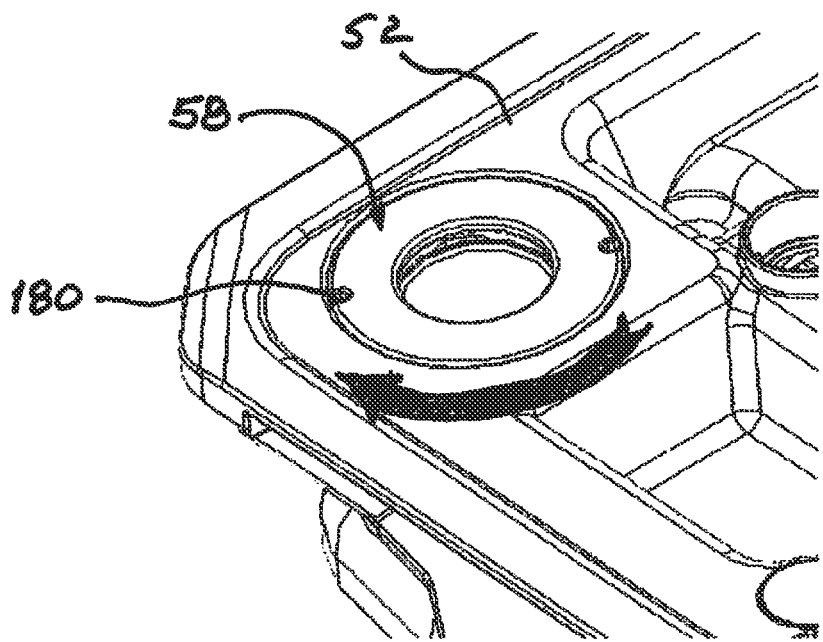
Figure 10C:
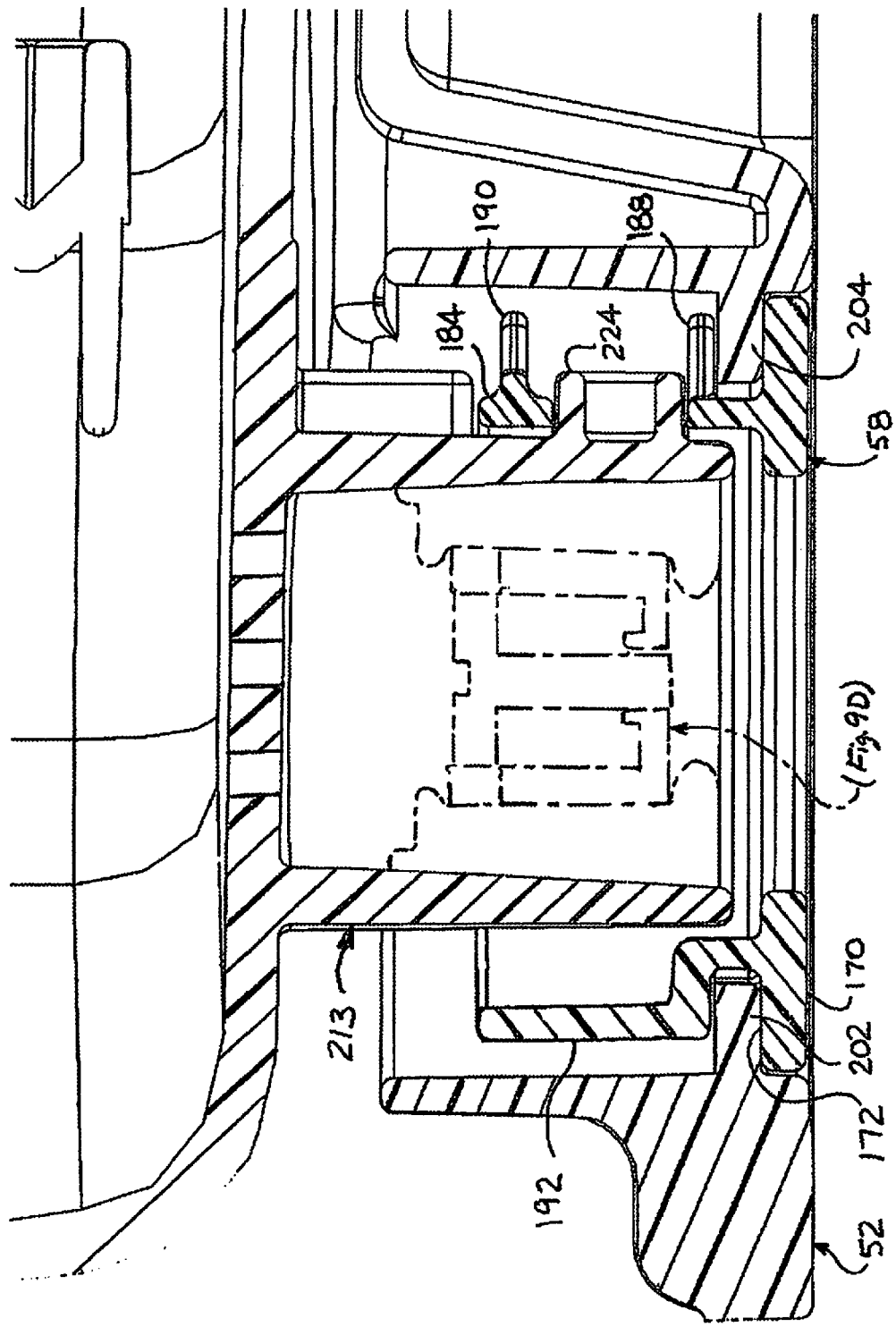
FIG. 10C is a cross sectional view through a boss and twist lock connector with a purge grommet with a check valve shown in phantom in accord with embodiments of the inventions.

Referring to FIGS. 10A and 10B, the twist lock connector 58 is depicted in operation. The twist lock connector 58 is oriented so that the boss 192 is aligned with the first gap 212 between the interior flanges 202, 204 of the locking port 200 and the outward and inward tabs 188, 190 are aligned with the second gap 214 (FIG. 10A). The twist lock connector 58 is then disposed in the locking port 200 so that the boss 192 and outward/inward tabs 188, 190 pass through the first and second gaps 212, 214 and the pin 224 of the access port 216 enters the tangential slot 186 of the twist lock connector. The inward-facing surface 172 of the flange 166 of the twist lock connector then contacts the interior flanges 202, 204 and protrusion 210 of the locking port 200.

At this point, the inward-facing surface 172 of the flange 166 of the twist lock connector also contacts the detent 209 on the distal end of the locking arm 208, causing the locking arm 208 to bend away from inward-facing surface 172. The twist lock connector 58 is then rotated (FIG. 10B) so that the pin 224 is positioned within tangential slot 186 between the outward and inward tabs 188, 190. The rotation also aligns one of the recesses 180 on the inward-facing surface 172 of the flange 166 of the twist lock connector with the detent 209 at the distal end of the locking arm 208. The resilience of the locking arm 208 causes the detent 209 to snap into the recess 180.

Functionally, the twist lock connector 58 captures the interior flanges 202, 204 of the base plate 52 between the inward-facing surface 172 of the flange 166 of the twist lock connector and the boss 192 and the outward tab 188 of the twist lock connector 58. The tangential slot 186 and the pin 224 interact to secure the twist lock connector 58 against the ends of the gussets 223, which determines the axial position of the twist lock connector relative to the access port 216.

The interaction between the arcuate arm 184 and the gusset 223 that it contacts provides stability to the connector, inhibiting the twist lock connector from canting on the access port 216. The gusset 223 and pin 224 also secure the arcuate arm 184 in place to prevent the arcuate arm 184 from undergoing a bending moment under the load of the base plate. Instead, the transfer of forces to the arcuate arm 184 result primarily in a shear stress for improved strength. Also, the tangential dimension of the boss 192 and the inward tab 190 and the respective gaps 212, 214 that they pass through can be different to assure proper orientation of the twist lock connector 58 when locking the base plate 52 into place.

The detent 209 at the distal end of the locking arm 208 prevents rotational movement of the twist lock connector 58 under normal operation. The protrusion 210 relieves the distal end of the locking arm 208 from the being over-extended and provides a more stable registration of the twist lock connector 58. To remove the twist lock connector 58, pins can be inserted into the portion of the notch 176 that is accessible from the outward-facing surface 170 of the flange 166 of the twist lock connector. The insertion depresses the locking arm 208 so that the detent 209 is freed from the recess 180, and the twist lock connector 58 can be rotated out of position.

The components of the wafer carrier described above may be conventially formed by injection molding polymers and assembly of the components.

What is claimed is:

1. A front opening wafer carrier comprising:
    a container portion with a door frame and a door receivable in the door frame to sealingly close the wafer carrier;
    the container portion comprising a plurality of columns of wafer shelves arranged for receiving a plurality of wafers;
    the door having an inside facing surface, an outside facing surface, and a periphery, the door comprising a latching mechanism with latching portions for engaging with the door frame for securing the door in the door frame at a seated position, and a wafer retainer attached at the inside facing surface of the door;
    the wafer retainer comprising a framework and a pair of columns of cantilevered fingers, each cantilevered finger comprising a fixed end portion that is substantially flat and of uniform thickness and extends directly laterally and contiguously from a flat portion of the framework that is of uniform thickness to the fixed end portion, an intermediate portion attached to the fixed end portion, and a distal portion attached to the intermediate portion, the distal portion having a distal tip, each pair of adjacent cantilevered fingers defining a slot therebetween, the slot terminating at the fixed end portions of the cantilevered fingers so that the entirety of each cantilevered finer is cantilevered from the framework, each cantilevered finger having an upper edge portion, a lower edge portion, a middle portion extending intermediate the upper edge portion and lower edge portion, and a wafer receiving groove portion that extends from the distal tip to the intermediate portion, the wafer receiving groove portion having a groove apex that is positioned more proximate to the upper edge portion than the middle portion at the distal tip and extends to a position more proximate the middle portion than the upper edge portion at the intermediate portion of each cantilevered finger, each wafer receiving groove extending a distance at least more than half of the length of the respective cantilevered finger and wherein each slot defined by adjacent airs of cantilevered fingers extends the entirety of the lengths of the wafer receiving grooves of the respective cantilevered fingers.

2. The front opening wafer carrier of claim 1, wherein the wafer curler is sized for 450 mm wafers, and each of the cantilevered fingers is configured to position the distal tip such that as the door is inserted into the door frame with wafers seated in the container portion, each of the wafers first engage a respective one of the cantilevered fingers more proximate the distal tip than the fixed end portion.

3. The front opening, wafer carrier of claim 2 wherein each wafer receiving groove has a length extending from the distal tip to a groove termination proximate the fixed end portion and wherein each cantilevered finger is configured such that when the door is fully seated, a respective one of the plurality of wafers engages a substantial length of the wafer receiving groove.

4. The front opening wafer carrier of claim 1 wherein each column of the pair of columns of cantilevered fingers cantilevers in a direction toward the other of the pair of columns of cantilevered fingers.

5. The front opening wafer carrier of claim 4 wherein the wafer retainer comprises an additional column of fixed wafer supports each with a V-shaped wafer edge receiving surface.

6. The front opening wafer carrier of claim 1, wherein each cantilevered finger has a wafer engaging surface facing away from the door, the wafer engaging surface for contacting a top edge and a bottom edge of each wafer, and wherein the wafer receiving groove divides the wafer engaging surface between an upper surface and a lower surface and wherein the upper surface has a less area that the lower surface.

7. The front opening wafer carrier of claim 1, wherein each cantilevered finger is configured to cantilever away from the frame member in a horizontal direction and to bend downwardly proximate the distal tip.

8. The front opening wafer carrier of claim 1, wherein the framework of the wafer retainer comprises:
    an upper horizontal frame member and a lower horizontal frame member, the upper horizontal frame member spaced from the lower horizontal frame member;

four vertical support members, each extending from the upper horizontal frame member and the lower horizontal frame member, two of the vertical support members being associated with the two columns of cantilevered fingers.

9. A front opening wafer carrier comprising a container portion with a door frame and a door receivable in the door frame to sealingly close the wafer carrier, the container portion comprising a plurality of columns of wafer shelves arranged for receiving a plurality of wafers, the door having an inside facing surface, an outside facing surface, a periphery, and comprising a latching mechanism with latching portions that engage with the door frame for securing the door therein at a seated position, the door further comprising a wafer retainer attached at the inside facing surface of the door, the wafer retainer comprising a framework and a pair of columns of cantilevered fingers, each cantilevered finger comprising a fixed end portion that is substantially flat and of uniform thickness and extends directly laterally and contiguously from a flat portion of the framework that is of uniform thickness to the fixed end portion, each pair of adjacent cantilevered fingers defining a slot therebetween, the slot terminating at the fixed end portions of the cantilevered fingers so that the entirety of each cantilevered finer is cantilevered from the framework, each cantilevered finger having a length, an upper edge portion, a lower edge portion, and a distal portion with a distal tip, each cantilevered finger further having a wafer receiving groove portion that extends from proximate the distal tip toward the intermediate portion, each wafer receiving groove extending a distance at least more than half of the length of the respective cantilevered finger and each wafer receiving groove terminating before the fixed end of the respective cantilevered finger so that the slot defined between adjacent cantilevered fingers extends the entirety of the lengths of the wafer receiving grooves of the respective cantilevered fingers and wherein the intermediate portion and distal portion of each cantilevered finger angles downwardly from the fixed end of each cantilevered finger.

10. The front opening wafer carrier of claim 9, wherein the wafer carrier is sized for 450 mm wafers, and each of the cantilevered fingers is configured to position the distal tip such that as the door is inserted into the door frame with wafers seated in the container portion, each of the wafers first engage a respective one of the cantilevered fingers more approximate the distal tip than the fixed end portion.

11. The front opening wafer carrier of claim 10 wherein each wafer receiving groove has a length extending from the distal tip to a groove termination proximate the fixed end portion and wherein each cantilevered finger is configured such that, when the door is fully seated, a respective one of the plurality of wafers engages a substantial length of the wafer receiving groove.

12. The front opening wafer carrier of claim 9 wherein each column of cantilevered fingers cantilevers in a direction toward the other column of cantilevered fingers and wherein the wafer retainer comprises two columns of fixed wafer supports positioned intermediate the two columns of cantilevered fingers.

13. The front opening wafer carrier of claim 9, wherein the wafer receiving groove portion includes a groove apex that is positioned proximate to the upper edge portion at the distal tip and extends to a position proximate a vertical middle of the cantilevered finger at the intermediate portion.

14. A front opening wafer container for 450 mm wafers, comprising:
a container portion with a forward door frame and a door receivable in the door frame to sealingly close the wafer container, the container portion comprising a plurality of columns of wafer shelves arranged for receiving a plurality of wafers and vertically aligning the plurality of wafers in a spaced stack, the door having an inside facing surface, an outside facing surface, a periphery, and comprising a latching mechanism with latching portions at the periphery that engage with the door frame for securing the door therein at a seated position, the door further comprising a wafer retainer attached at the inside facing surface of the door, the wafer retainer comprising at least one column of vertically aligned fixed non cantilevered wafer supports with a wafer engaging recess for each wafer of the spaced stack, outboard therefrom a pair of columns of cantilevered fingers, each of the pair of columns being associated with a vertical support member, each cantilevered finger having a fixed end portion that is substantially flat and of uniform thickness and extends directly laterally and contiguously from a flat portion of the respective vertical support member that is of uniform thickness to the fixed end portion, an intermediate portion supported by the fixed end portion and a distal portion supported by the intermediate portion, the intermediate portion extending horizontally and the distal portion extending at an acute angle downwardly from horizontal, each pair of adjacent cantilevered fingers defining a slot therebetween, the slot terminating at the fixed end portions of the cantilevered fingers so that the entirety of each cantilevered finer is cantilevered from the framework, each cantilevered finger having a wafer engaging groove traversing across the distal portion of each cantilevered finger, each wafer receiving groove extending a distance at least more than half of the length of the respective cantilevered finger and wherein each slot defined by adjacent pairs of cantilevered fingers extends the entirety of the lengths of the wafer receiving grooves of the respective cantilevered fingers.

15. The front opening wafer container of claim 14 wherein each of the cantilevered fingers of each of the columns of cantilevered fingers are cantilevered towards the other column of cantilevered fingers.

16. The front opening wafer container of claim 14 wherein the wafer engaging groove on each distal portion of each cantilevered finger is not parallel to a top margin of the distal portion of the cantilevered finger.

* * * * *